(12) United States Patent
Waki

(10) Patent No.: US 10,985,772 B2
(45) Date of Patent: Apr. 20, 2021

(54) SEMICONDUCTOR INTEGRATED CIRCUIT, A/D CONVERTER, DELTA SIGMA-TYPE A/D CONVERTER, INCREMENTAL DELTA SIGMA-TYPE A/D CONVERTER, AND SWITCHED CAPACITOR

(71) Applicants: Kabushiki Kaisha Toshiba, Tokyo (JP); Toshiba Electronic Devices & Storage Corporation, Tokyo (JP)

(72) Inventor: Naoya Waki, Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/784,597

(22) Filed: Feb. 7, 2020

(65) Prior Publication Data
US 2021/0083684 A1 Mar. 18, 2021

(30) Foreign Application Priority Data
Sep. 12, 2019 (JP) .............................. JP2019-166244

(51) Int. Cl.
*H03M 1/00* (2006.01)
*H03M 1/12* (2006.01)
(Continued)

(52) U.S. Cl.
CPC .............. *H03M 1/124* (2013.01); *G06F 1/06* (2013.01); *H03K 5/00* (2013.01);
(Continued)

(58) Field of Classification Search
CPC .... H03M 1/1215; H03M 1/1245; H03M 1/44; H03M 1/00; H03M 1/124; H03M 1/0836; H03M 1/12; H03M 1/0624; H03M 1/466
(Continued)

(56) References Cited

U.S. PATENT DOCUMENTS 8,004,435 B2 8/2011 Waki et al.
8,471,755 B1* 6/2013 Figueiredo ............ H03M 1/468
341/172
(Continued)

FOREIGN PATENT DOCUMENTS

JP 2009-027281 A 2/2009
JP 2009-027282 A 2/2009
(Continued)

*Primary Examiner* — Linh V Nguyen
(74) *Attorney, Agent, or Firm* — White & Case LLP

(57) ABSTRACT

According to one embodiment, a semiconductor integrated circuit 1 includes a sample and hold circuit and a clock generation circuit. The sample and hold circuit has a device with a first withstand voltage and a device with a second withstand voltage that is higher than the first withstand voltage. The clock generation circuit generates a first clock signal to be supplied to the first withstand voltage device and generates a second clock signal to be supplied to the second withstand voltage device based on the first clock signal. The clock generation circuit has a delay adjustment circuit that performs adjustment to delay the second clock signal and bring a phase of the second clock signal close to a phase of the first clock signal in the generation of the second clock signal.

16 Claims, 21 Drawing Sheets

(51) Int. Cl.
*H03M 3/00* (2006.01)
*H03K 19/0175* (2006.01)
*G06F 1/06* (2006.01)
*H03K 5/00* (2006.01)

(52) U.S. Cl.
CPC .... *H03K 19/017509* (2013.01); *H03M 3/494* (2013.01); *H03K 2005/00019* (2013.01)

(58) Field of Classification Search
USPC .............................. 341/122–124, 143, 172
See application file for complete search history.

(56) References Cited

U.S. PATENT DOCUMENTS

| | | | | |
|---|---|---|---|---|
| 8,902,093 | B1* | 12/2014 | Leuciuc | H03M 1/1245 |
| | | | | 341/122 |
| 8,922,408 | B2 | 12/2014 | Masuda | |
| 9,019,229 | B2* | 4/2015 | Guedon | H03M 11/20 |
| | | | | 345/174 |
| 9,184,760 | B2 | 11/2015 | Masuda | |
| 10,020,968 | B1* | 7/2018 | Rodenbeck | H04L 27/227 |
| 10,438,677 | B1* | 10/2019 | Gupta | H03M 1/0863 |
| 2006/0279445 | A1* | 12/2006 | Kinyua | H03M 1/0624 |
| | | | | 341/155 |
| 2007/0285296 | A1* | 12/2007 | Bilhan | H03M 1/0629 |
| | | | | 341/155 |
| 2009/0278716 | A1* | 11/2009 | Kawahito | H03M 1/1009 |
| | | | | 341/120 |
| 2012/0176261 | A1* | 7/2012 | Ishioka | H03M 1/1014 |
| | | | | 341/123 |
| 2014/0077985 | A1* | 3/2014 | Tokunaga | H03M 3/32 |
| | | | | 341/143 |
| 2016/0105195 | A1* | 4/2016 | Mulder | G11C 27/026 |
| | | | | 341/122 |
| 2019/0190529 | A1* | 6/2019 | Baker | H04B 1/0003 |
| 2020/0304140 | A1 | 9/2020 | Waki | |

FOREIGN PATENT DOCUMENTS

JP 2010-193089 A 9/2010
JP 5845160 B2 1/2016

* cited by examiner

SEMICONDUCTOR INTEGRATED CIRCUIT, A/D CONVERTER, DELTA SIGMA-TYPE A/D CONVERTER, INCREMENTAL DELTA SIGMA-TYPE A/D CONVERTER, AND SWITCHED CAPACITOR

CROSS-REFERENCE TO RELATED APPLICATIONS

This application is based upon and claims the benefit of priority from Japanese Patent Application No. 2019-166244, filed on Sep. 12, 2019; the entire contents of which are incorporated herein by reference.

FIELD

Embodiments described herein relate generally to a semiconductor integrated circuit, an A/D converter, a delta sigma-type A/D converter, an incremental delta sigma-type A/D converter, and a switched capacitor.

BACKGROUND

Conventionally, in an A/D converter, an input signal is sampled by a sample and hold circuit and held for a certain period to convert the input signal into a discrete signal. This sample and hold circuit is generally composed of a device having an electric withstand voltage equivalent to an input range of an input signal in order to satisfy an electric withstand voltage.

If a clock timing in the sample and hold circuit is inappropriate, operation accuracy of the sample and hold circuit may be reduced. For this reason, improvement in accuracy is required for the sample and hold circuit.

DETAILED DESCRIPTION

In general, according to one embodiment, a semiconductor integrated circuit includes a sample and hold circuit and a clock generation circuit. The sample and hold circuit includes a device with a first withstand voltage and a device with a second withstand voltage higher than the first withstand voltage. The clock generation circuit generates a first clock signal to be supplied to the first withstand voltage device, and generates a second clock signal to be supplied to the second withstand voltage device based on the first clock signal. The clock generation circuit has a delay adjustment circuit that performs adjustment to delay the second clock signal and bring the phase of the second clock signal close to the phase of the first clock signal in the generation of the second clock signal.

Exemplary embodiments of a semiconductor integrated circuit, an A/D converter, a delta sigma-type A/D converter, an incremental delta sigma-type A/D converter, and a switched capacitor will be explained below in detail with reference to the accompanying drawings. The present invention is not limited to the following embodiments.

First Embodiment

Figure 1:
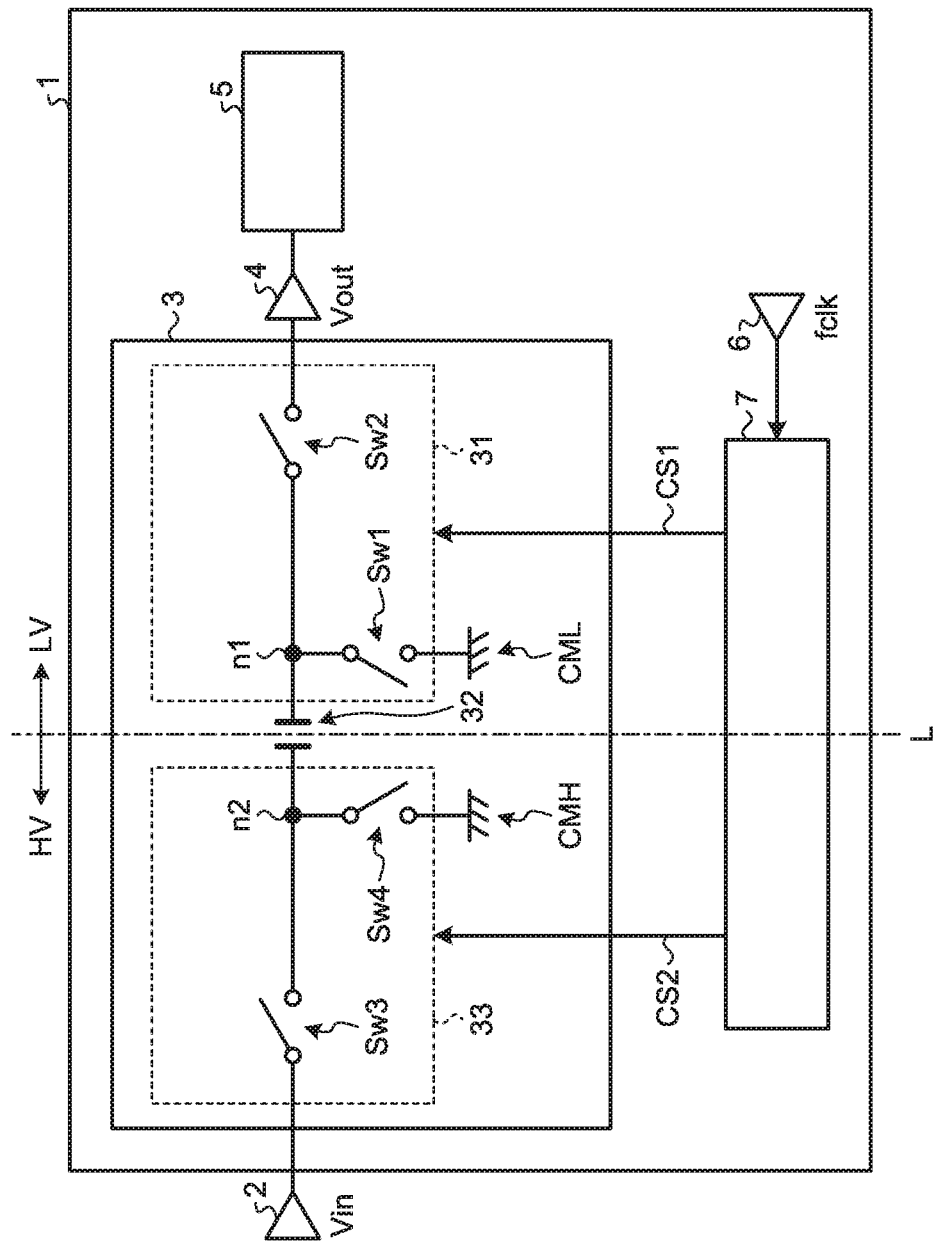
FIG. 1 is a block diagram illustrating an overall configuration of a semiconductor integrated circuit according to a first embodiment.

FIG. 1 is a block diagram illustrating an overall configuration of a semiconductor integrated circuit 1 according to a first embodiment. The semiconductor integrated circuit 1 includes a sample and hold circuit 3, an analog-to-digital (A/D) converter 5, and a clock generation circuit 7. The sample and hold circuit 3 includes a device 31 with a first withstand voltage, a capacitor 32, and a device 33 with a second withstand voltage higher than the first withstand voltage. The first withstand voltage device 31 corresponds to a low withstand voltage (LV) device (hereinafter referred to as "low withstand voltage device"). The second withstand voltage device 33 corresponds to a high withstand voltage (HV) device (hereinafter referred to as "high withstand voltage device"). A withstand voltage means a limit of voltage that can be applied to equipment and electronic components. Specifically, the withstand voltage is a voltage value determined by a rating or the like. The first withstand voltage is, for example, 1.5 volts. Further, the second withstand voltage is, for example, 5.5 volts. In FIG. 1, the right side of a dashed-dotted line L is a region corresponding to the first withstand voltage (hereinafter referred to as "LV domain"), and the left side of the dashed-dotted line L is a region corresponding to the second withstand voltage (hereinafter referred to as "HV domain").

For convenience of explanation, FIG. 1 illustrates an input terminal 2 to the sample and hold circuit 3, an output terminal 4 from the sample and hold circuit 3, and an input terminal 6 to the clock generation circuit 7. Note that FIG. 1 is illustrated in a single-ended configuration for the sake of simplicity, but the present embodiment is also applicable to a differential configuration. The input terminal 2 is a terminal related to an input signal Vin input to the sample and hold circuit 3. The output terminal 4 is a terminal related to an output signal Vout output from the sample and hold circuit 3. The input terminal 6 is a terminal related to a reference clock signal fclk input to the clock generation circuit 7. The reference clock signal fclk is generated by, for example, a phase locked loop (PLL) circuit disposed in the LV domain. Note that the domain in which the PLL circuit that generates the reference clock signal fclk is disposed is not limited to the LV domain, and the domain may be disposed in the HV domain.

An A/D converter 5 is coupled to a subsequent stage of the sample and hold circuit 3. The A/D converter 5 generates digital data (hereinafter referred to as "ADC output digital code") based on the output signal Vout output from the sample and hold circuit 3. Note that the sample and hold circuit 3 can be applied to a delta sigma (ΔΣ)-type A/D converter or an incremental delta sigma (ΔΣ)-type A/D converter. The delta sigma-type A/D converter and the incremental delta sigma-type A/D converter will be respectively described in a third embodiment and a fourth embodiment. Note that the semiconductor integrated circuit 1 in the first embodiment may be realized by the sample and hold circuit 3 and the clock generation circuit 7. At this time, the semiconductor integrated circuit is mounted on the A/D converter. Further, the sample and hold circuit 3 is also referred to as "switched capacitor circuit". At this time, the switched capacitor may be realized by a semiconductor integrated circuit including the sample and hold circuit 3 and the clock generation circuit 7.

The low withstand voltage device 31 includes a first switch element Sw1 and a second switch element Sw2. The first switch element Sw1 and the second switch element Sw2 include, for example, low withstand voltage MOS transistors. The high withstand voltage device 33 includes a third switch element Sw3 and a fourth switch element Sw4. The third switch element Sw3 and the fourth switch element Sw4 include, for example, high withstand voltage MOS transistors.

One end of the first switch element Sw1 is coupled to a node n1, and the other end of the first switch element Sw1 is coupled to a common mode voltage CML. The common mode voltage CML is, for example, 0.5 volts. The first switch element Sw1 is turned on or off by a signal related to the first switch element Sw1 (hereinafter referred to as "first switch signal") in the first clock signals CS1. More specifically, the first switch element Sw1 is turned on when the first switch signal is at an H level and is turned off when the first switch signal is at an L level.

One end of the second switch element Sw2 is coupled to the output terminal 4, and the other end of the second switch element Sw2 is coupled to the node n1. The second switch element Sw2 is turned on or off by a signal related to the second switch element Sw2 (hereinafter referred to as "second switch signal") in the first clock signals CS1. More specifically, the second switch element Sw2 is turned on when the first switch signal is at an H level, and is turned off when the first switch signal is at an L level.

One end of the third switch element Sw3 is coupled to the input terminal 2, and the other end of the third switch element Sw3 is coupled to a node n2. The third switch element Sw3 is turned on or off by a signal related to the third switch element Sw3 (hereinafter referred to as a third switch signal) in second clock signals CS2. More specifically, the third switch element Sw3 is turned on when the third switch signal is at an H level and is turned off when the third switch signal is at an L level.

One end of the fourth switch element Sw4 is coupled to the node n2, and the other end of the fourth switch element Sw4 is coupled to a common mode voltage CMH. The common mode voltage CMH is, for example, 2.5 volts. The fourth switch element Sw4 is turned on or off by a signal related to the fourth switch element Sw4 (hereinafter referred to as "fourth switch signal") in the second clock signal CS2. More specifically, the fourth switch element Sw4 is turned on when the fourth switch signal is at an H level and is turned off when the fourth switch signal is at an L level.

The capacitor 32 is a capacitor for sampling and holding the input signal Vin. One end of the capacitor 32 is coupled to the node n1, and the other end of the capacitor 32 is coupled to the node n2.

Figure 2:
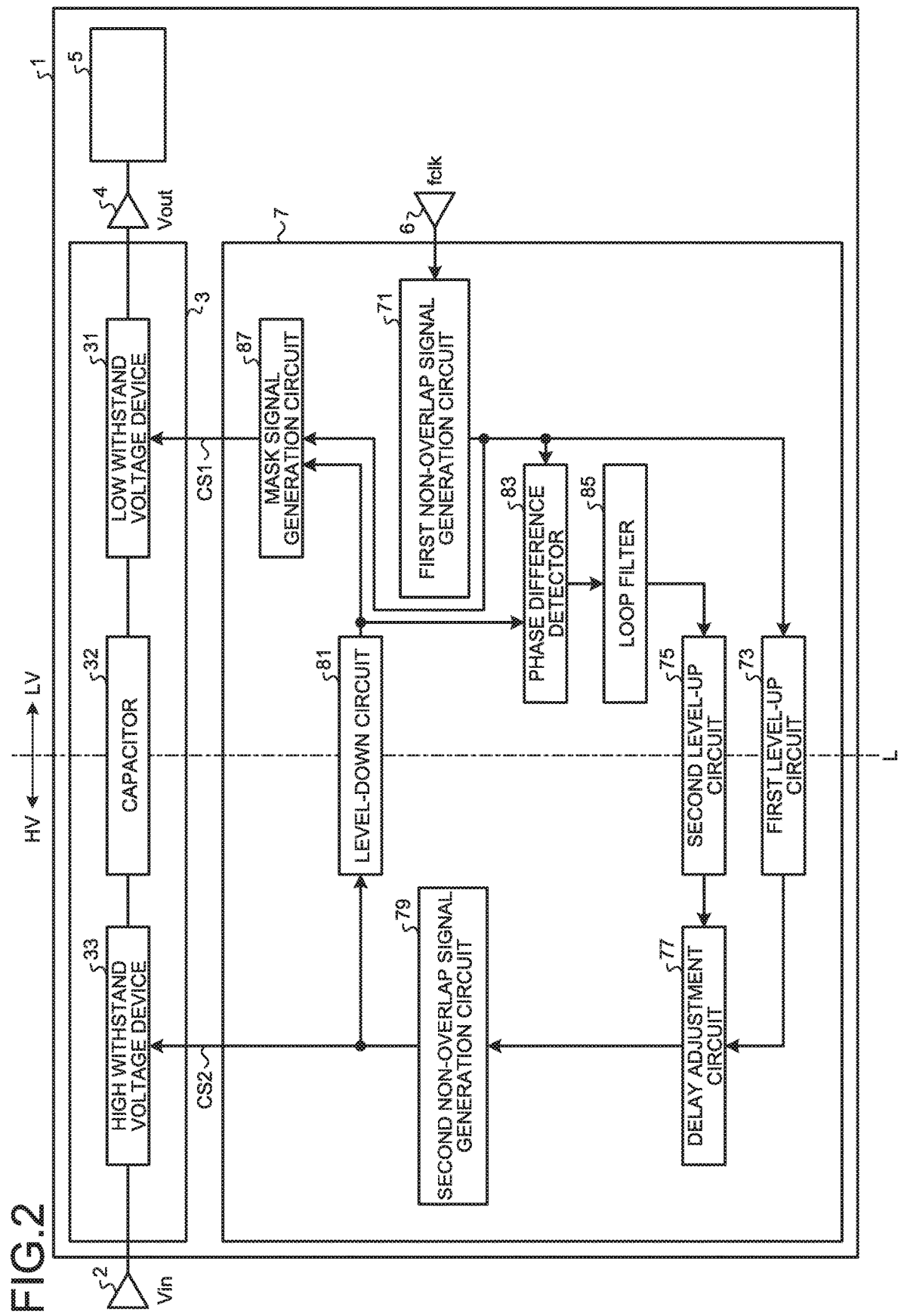
FIG. 2 is a diagram illustrating an example of a configuration of a clock generation circuit according to the first embodiment.

FIG. 2 is a diagram illustrating an example of a configuration in the clock generation circuit 7. The clock generation circuit 7 includes a first non-overlap signal generation circuit 71, a first level-up circuit 73, a second level-up circuit 75, a delay adjustment circuit 77, a second non-overlap signal generation circuit 79, a level-down circuit 81, a phase difference detector 83, a loop filter 85, and a mask signal generation circuit 87. Similarly to the sample and hold circuit 3, the clock generation circuit 7 has the HV domain and the LV domain.

In the clock generation circuit 7, the signal conversion from the LV domain to the HV domain is executed by a level-up circuit indicated by the first level-up circuit 73 and the second level-up circuit 75. The level-up circuit increases the voltage level of the signal in the LV domain so as to match the voltage level of the second withstand voltage (high withstand voltage). For example, the level-up circuit increases the amplitude of the signal indicating 1 volt in the LV domain to an amplitude corresponding to 5 volts. Further, in the clock generation circuit 7, the signal conversion from the HV domain to the LV domain is executed by the level-down circuit 81. The level-down circuit 81 reduces the voltage level of the signal in the HV domain so as to match a low withstand voltage level. For example, the level-down circuit 81 reduces the amplitude of the signal indicating 5 volts in the HV domain to an amplitude corresponding to 1 volt. Signal transmission in the LV domain and the HV domain is realized by the level-up circuit and the level-down circuit 81.

In general, an operable frequency becomes low as a device has a high withstand voltage. That is, the high withstand voltage device on the second withstand voltage side is slower than the low withstand voltage device 31 on the first withstand voltage side. Further, when a reference clock signal fclk1 of the low withstand voltage device on the first withstand voltage side and a reference clock signal fclk2 of the high withstand voltage device on the second withstand voltage side are supplied from different clock sources, in the clock generation circuit in the semiconductor integrated circuit 1, it is highly likely that the relative relationship between the reference clock signals fclk1 and fclk2 is not easily controlled. Therefore, in the first embodiment, the low withstand voltage device on the first withstand voltage side in the clock generation circuit 7 generates the first clock signal CS1 to be supplied to the first withstand voltage device 31 based on the reference clock signal fclk. Further, the high withstand voltage device on the second withstand voltage side in the clock generation circuit 7 generates the second clock signal CS2 to be supplied to the high withstand voltage device 33 based on the first clock signal CS1. Note that the high withstand voltage device on the second withstand voltage side in the clock generation circuit 7 may use the shifted reference clock signal by shifting a voltage level of the reference clock signal fclk by the level-up circuit.

From these facts, the relative relationship between the clock frequency and the phase in the low withstand voltage device 31 on the first withstand voltage side and the high withstand voltage device 33 on the second withstand voltage side becomes clear to make control easy. That is, the clock generation circuit 7 respectively generates the first clock signal CS1 and the second clock signal CS2 by the devices on the first withstand voltage side and the second withstand voltage side. As a result, it is possible to satisfy the withstand voltages of the devices on the first withstand voltage side and the second withstand voltage side.

The first non-overlap signal generation circuit 71 uses the reference clock signal fclk input from the input terminal 6 and generates a clock signal before mask-processing by the mask signal generation circuit 87 (hereinafter referred to as "pre-mask clock signal"). The pre-mask clock signal is a clock signal in which the H level of the first switch signal and the H level of the second switch signal do not overlap. A conduction state of the first switch element Sw1 and a conduction state of the second switch element Sw2 are controlled by the pre-mask clock signal so as not to overlap.

The first level-up circuit 73 increases a voltage level of the pre-mask clock signal so as to match the HV domain. Specifically, the first level-up circuit 73 increases a voltage value indicating the amplitude of the first switch signal and a voltage value indicating the amplitude of the second switch signal. Thereby, the first level-up circuit 73 shifts voltage levels of the first switch signal and the second switch signal to a voltage level related to the second withstand voltage.

The second level-up circuit 75 increases a voltage level of a DC voltage output from a loop filter 85 so as to match the HV domain. The DC voltage output from the loop filter 85 has a voltage value corresponding to a phase error signal output from the phase difference detector 83. Specifically, the second level-up circuit 75 increases the value of the DC voltage. As a result, the second level-up circuit 75 shifts the voltage level of the DC voltage to a voltage level related to the second withstand voltage. Note that if the DC voltage output from the loop filter 85 exceeds an operating point of a transistor used in the delay adjustment circuit 77, the DC voltage may be directly input to the delay adjustment circuit 77 without being leveled up. At this time, the second level-up circuit 75 is not necessary.

In the generation of the second clock signal CS2, the delay adjustment circuit 77 performs adjustment to delay the second clock signal CS2 so as to bring the phase of the second clock signal CS2 close to the phase of the first clock signal CS1. That is, the delay adjustment circuit 77 delays the first clock signal CS1 by a delay amount corresponding to a phase error signal and generates the second clock signal CS2. Specifically, the delay adjustment circuit 77 delays a pre-mask clock signal converted to a voltage level of the HV domain by the first level-up circuit 73 using a DC voltage output from the loop filter 85. A circuit example of the delay adjustment circuit 77 will be described below in relation to the delay adjustment operation. Further, in FIG. 2, the delay adjustment circuit 77 is provided on a subsequent stage of the second level-up circuit 75, but may be provided on the front stage of the second level-up circuit 75 or the front stage and the subsequent stage of the second level-up circuit 75. These cases will be described below in a modification.

The second non-overlap signal generation circuit 79 generates a third switch signal and a fourth switch signal using the delayed pre-mask clock signal so as not to overlap the H level of the third switch signal and the H level of the fourth switch signal. Thereby, the second non-overlap signal generation circuit 79 generates a second clock signal CS2 having a third switch signal and a fourth switch signal. A conduction state of the third switch element Sw3 and a conduction state of the fourth switch element Sw4 are controlled by the second clock signal CS2 so as not to overlap.

The level-down circuit 81 shifts a voltage level of the second clock signal CS2 to a level related to the first withstand voltage. That is, the level-down circuit 81 reduces the voltage level of the second clock signal CS2 so as to match a low withstand voltage level. Hereinafter, the second clock signal CS2 whose voltage level is reduced, that is, a level down signal of the second clock signal CS2 is referred to as "low withstand voltage clock signal".

The phase difference detector 83 compares the phase of the low withstand voltage clock signal output from the level-down circuit 81 with the phase of the pre-mask clock signal output from the first non-overlap signal generation circuit 71. By this comparison, the phase difference detector 83 detects the phase difference between the low withstand voltage clock signal and the pre-mask clock signal. Accordingly, the phase difference detector 83 generates a phase error signal corresponding to the phase difference between the level down signal of the second clock signal output from the level-down circuit 81 and the first clock signal. The phase error signal output from the phase difference detector 83 is a DC voltage. The phase error signal may have a frequency ripple component. Note that the phase difference detector 83 is disposed in the LV domain, but may be disposed in the HV domain. Even if the phase difference detector 83 is disposed in any power supply domain, a signal input to the phase difference detector 83 needs to be shared with the power supply domain in which the phase difference detector 83 is disposed.

The loop filter 85 removes the frequency ripple component in the phase error signal and smooths the phase error signal. As a result, the frequency ripple component is removed, and a DC voltage is input to the second level-up circuit 75.

The mask signal generation circuit 87 generates the first clock signal CS1 based on the low withstand voltage clock signal and the pre-mask clock signal. The mask signal generation circuit 87 for executing the mask processing is realized by, for example, a NAND gate or a logic circuit combining AND gates.

Specifically, the mask signal generation circuit 87 executes mask-processing to the pre-mask clock signal so as not to have an overlapping period (hereafter referred to as "first overlap period") between the H level period in the second switch signal and the H level period in the third switch signal. By the adjustment, it is possible to prevent the sample and hold function in the sample and hold circuit 3 from being disabled (NG) due to a short related to sampling. Further, the mask signal generation circuit 87 adjusts the pre-mask clock signal so as not to have an overlapping period (hereafter referred to as "second overlap period") between the H level period in the first switch signal and the H level period in the fourth switch signal. This adjustment can prevent the sample and hold function in the sample and hold circuit 3 from being disabled (NG) due to a short related to holding. Hereinafter, a period during which the sample and hold function is disabled is referred to as "disabled period". The mask signal generation circuit 87 uses the low withstand voltage clock signal to mask (shield) the disabled period including the first overlap period and the second overlap period with respect to the pre-mask clock signal, and thereby a first clock signal CS1 is generated.

Figure 3:
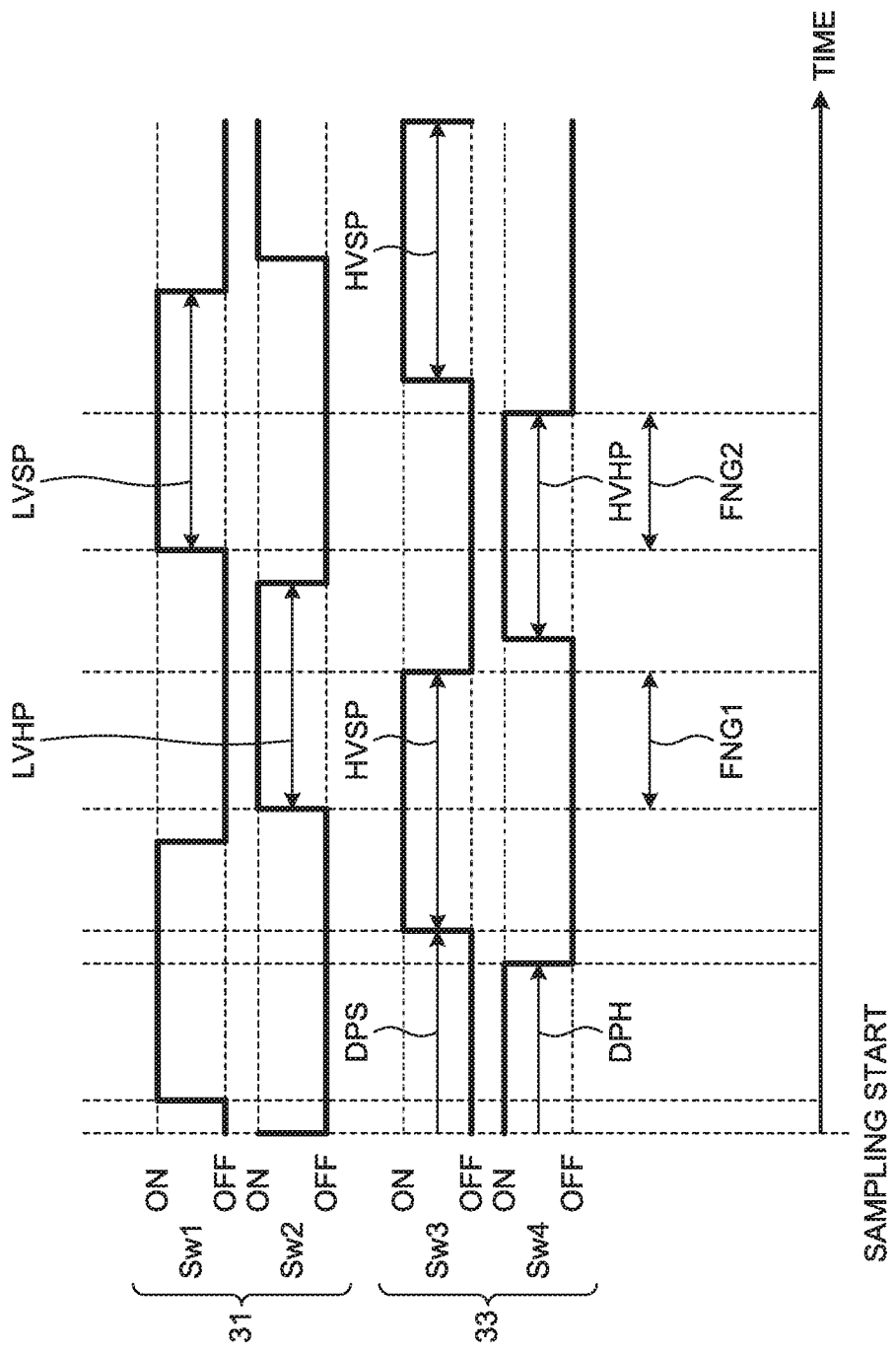
FIG. 3 is a diagram for explaining a disabled period in which a sample and hold function in a sample and hold circuit is disabled.

FIG. 3 is a diagram for explaining the disabled period in the sample and hold circuit 3. The disabled period illustrated in FIG. 3 appears in the operation of the first to fourth switch elements by the first clock signal and the second clock signal, output from the clock generation circuit not equipped with the mask signal generation circuit 87 and the delay adjustment circuit 77. As illustrated in FIG. 3, in the operation of the third switch element Sw3, a circuit delay DPS caused by the first level-up circuit 73, the second non-overlap signal generation circuit 79, and the like appears. Similarly, as illustrated in FIG. 3, in the operation of the fourth switch element Sw4, a circuit delay DPH caused by the first level-up circuit 73, the second non-overlap signal generation circuit 79, and the like appears.

When the mask signal generation circuit 87 and the delay adjustment circuit 77 are not equipped on the clock generation circuit, as illustrated in FIG. 3, a part of the hold period LVHP in which the second switch element Sw2 is turned on, and a part of the sample period HVSP in which the third switch element Sw3 is turned on overlap in the first overlap period FNG1. Further, when the mask signal generation circuit 87 and the delay adjustment circuit 77 are not equipped on the clock generation circuit, as illustrated in FIG. 3, a part of the sample period LVSP in which the first switch element Sw1 is turned on and a part of the hold period HVHP in which the fourth switch element Sw4 is turned on overlap in the second overlap period FNG2. The mask signal generation circuit 87 eliminates the sample and hold disabled period by masking (shielding) the pre-mask clock signal in the sample and hold disabled period including the first overlap period FNG1 and the second overlap period FNG2.

Figure 4:
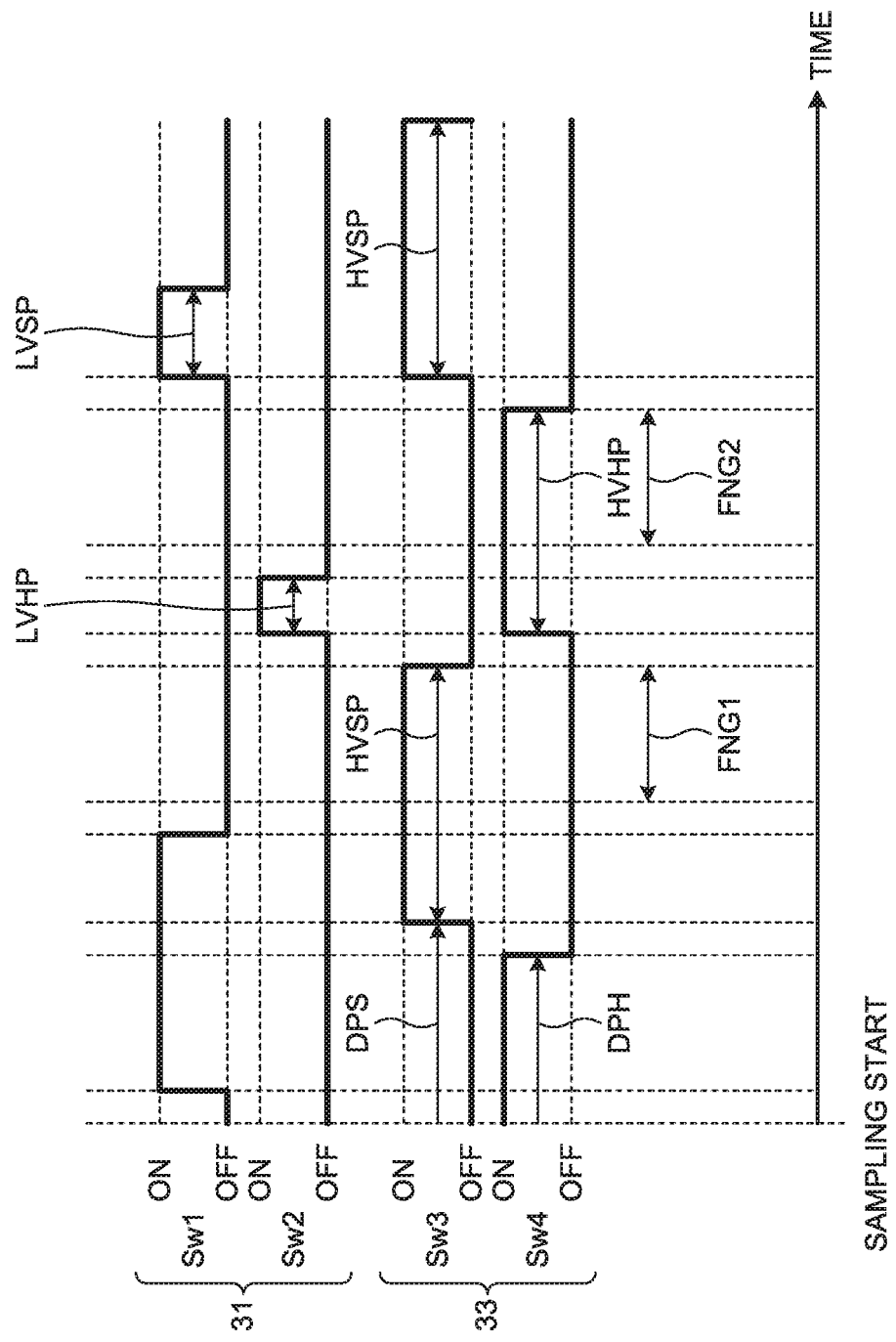
FIG. 4 is a diagram illustrating an example in which a sample period and a hold period decrease.

FIG. 4 is a diagram illustrating an example in which a sample period and a hold period decrease. The decrease in the sample period and the hold period appears in the operation of the first to fourth switch elements by the first clock signal and the second clock signal, output from the clock generation circuit that is equipped with the mask signal generation circuit 87 and not equipped with the delay adjustment circuit 77. Since the sample and hold disabled periods (FNG1 and FNG2) are shielded by the mask signal generation circuit 87, the substantial sample period and hold period in the sample and hold circuit 3 are reduced.

In the case illustrated in FIG. 4, by decreasing the sample period, the time until the input voltage to the sample and hold circuit 3 is set to a target voltage value (hereinafter referred to as "target value"), that is, a settling time may be insufficient. An insufficient settling time causes the accuracy of the voltage output from the sample and hold circuit 3 to decrease since sampling is interrupted before the input voltage reaches the target value.

Figure 5:
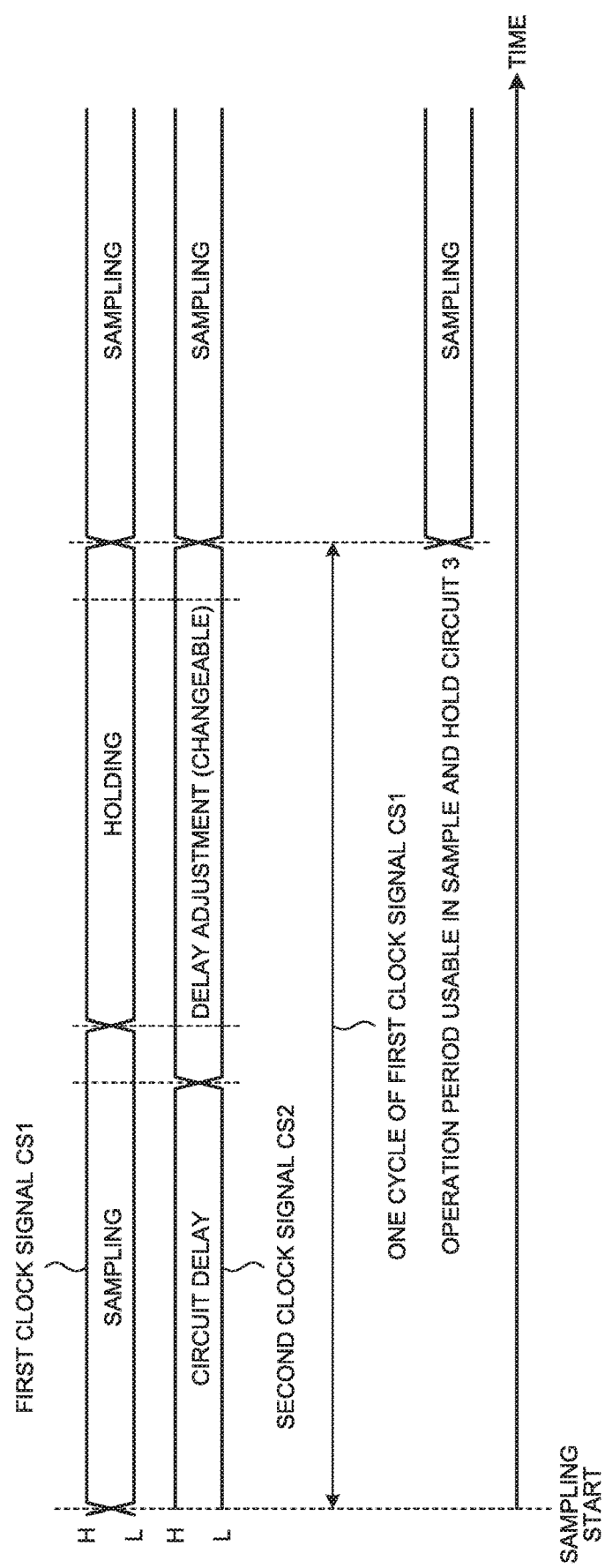
FIG. 5 is a diagram illustrating an example of an operation of the sample and hold circuit according to the first embodiment.

FIG. 5 is a diagram illustrating an example of the operation of the sample and hold circuit 3. The operation of the sample and hold circuit 3 uses the first clock signal CS1 and the second clock signal CS2 after the delay adjustment by the delay adjustment circuit 77. As illustrated in FIG. 5, the circuit delay in the HV domain in the clock generation circuit 7 is eliminated after one cycle of the first clock signal CS1 by delay adjustment by the delay adjustment circuit 77. That is, the first clock signal CS1 and the second clock signal CS2 have the same phase after one cycle of the first clock signal CS1. Thereby, as illustrated in FIG. 5, the period of the sample operation that can be used in the A/D converter 5 is increased as compared with FIG. 4.

Figure 6:
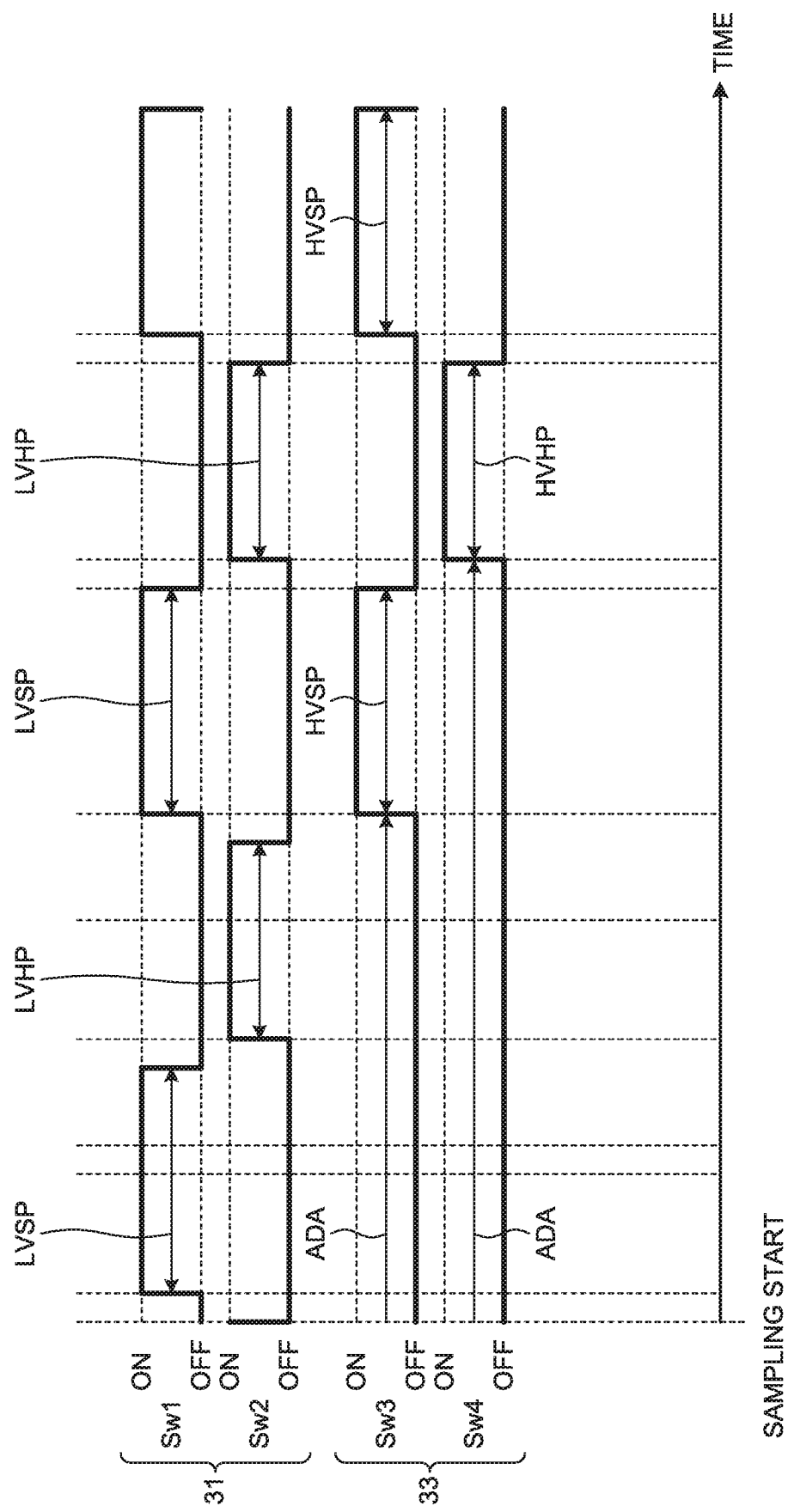
FIG. 6 is a diagram illustrating an example of operations of the first to fourth switch elements according to first and second clock signals output from the clock generation circuit according to the first embodiment.

FIG. 6 is a diagram illustrating an example of the operation of the first to fourth switch elements by the first clock signal CS1 and the second clock signal CS2 output from the clock generation circuit 7. As illustrated in FIG. 6, the ON timing of the third switch element Sw3 and the fourth switch element Sw4 is delayed by a delay amount ADA by the second clock signal CS2 that has been subjected to delay adjustment. Thereby, as illustrated in FIG. 6, the operation timings of the first switch element Sw1 and the third switch element Sw3 and the operation timings of the second switch element Sw2 and the fourth switch element Sw4 are synchronized. For these reasons, the sample period and the hold period in the sample and hold circuit 3 are increased as compared with FIG. 4, and the performance of the A/D converter 5 is improved. In addition, as illustrated in FIG. 6, the pre-mask clock signal corresponds to the first clock signal CS1.

Figure 7:
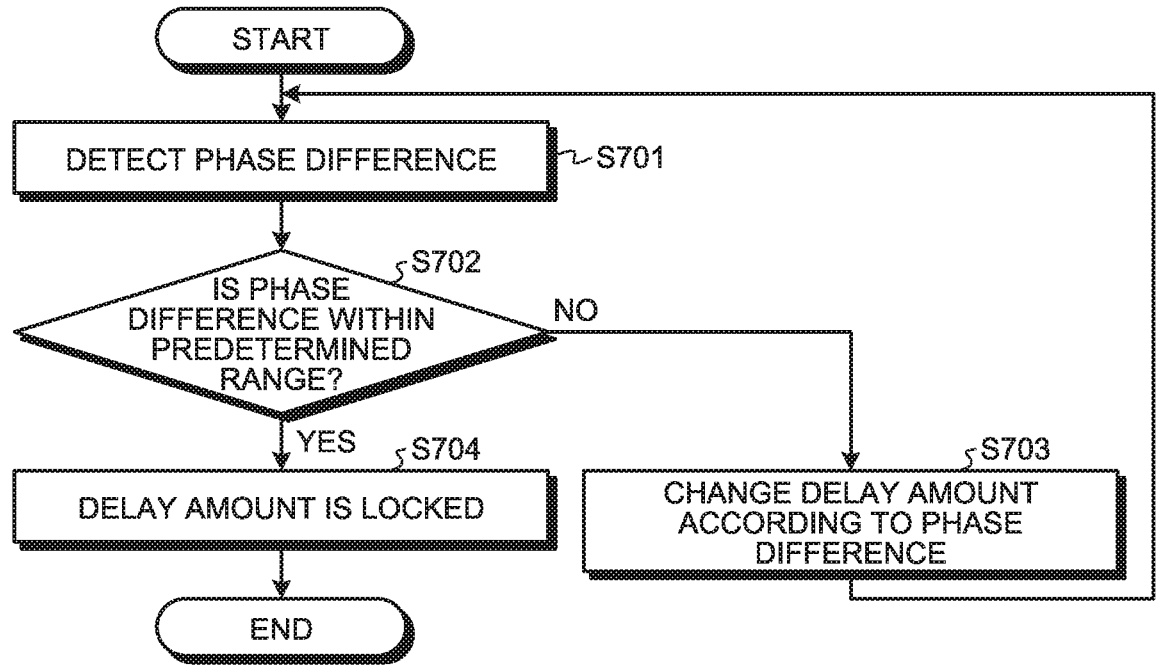
FIG. 7 is a diagram illustrating an example of an operation procedure in a delay adjustment operation according to the first embodiment.

The configuration in the semiconductor integrated circuit 1 has been described above. Hereinafter, an operation of detecting a phase difference and delay adjustment based on the detected phase difference (hereinafter referred to as "delay adjustment operation") will be described. FIG. 7 is a diagram illustrating an example of an operation procedure in the delay adjustment operation.

(Delay Adjustment Operation)

(Step S701)

The phase difference detector 83 detects a phase difference between a low voltage clock signal and a pre-mask clock signal. The detected phase difference reference is a phase of the pre-mask clock signal.

(Step S702)

The phase difference is compared with a predetermined range (hereinafter referred to as "phase range"). If the phase difference is within the phase range (YES in step S702), the process in step S704 is executed. When the phase difference is outside the phase range (NO in step S702), the process in step S703 is executed.

(Step S703)

A phase error signal is generated according to the detected phase difference. A delay amount is adjusted based on the generated phase error signal. The second clock signal CS2 is generated according to the adjusted delay amount.

Figure 8:
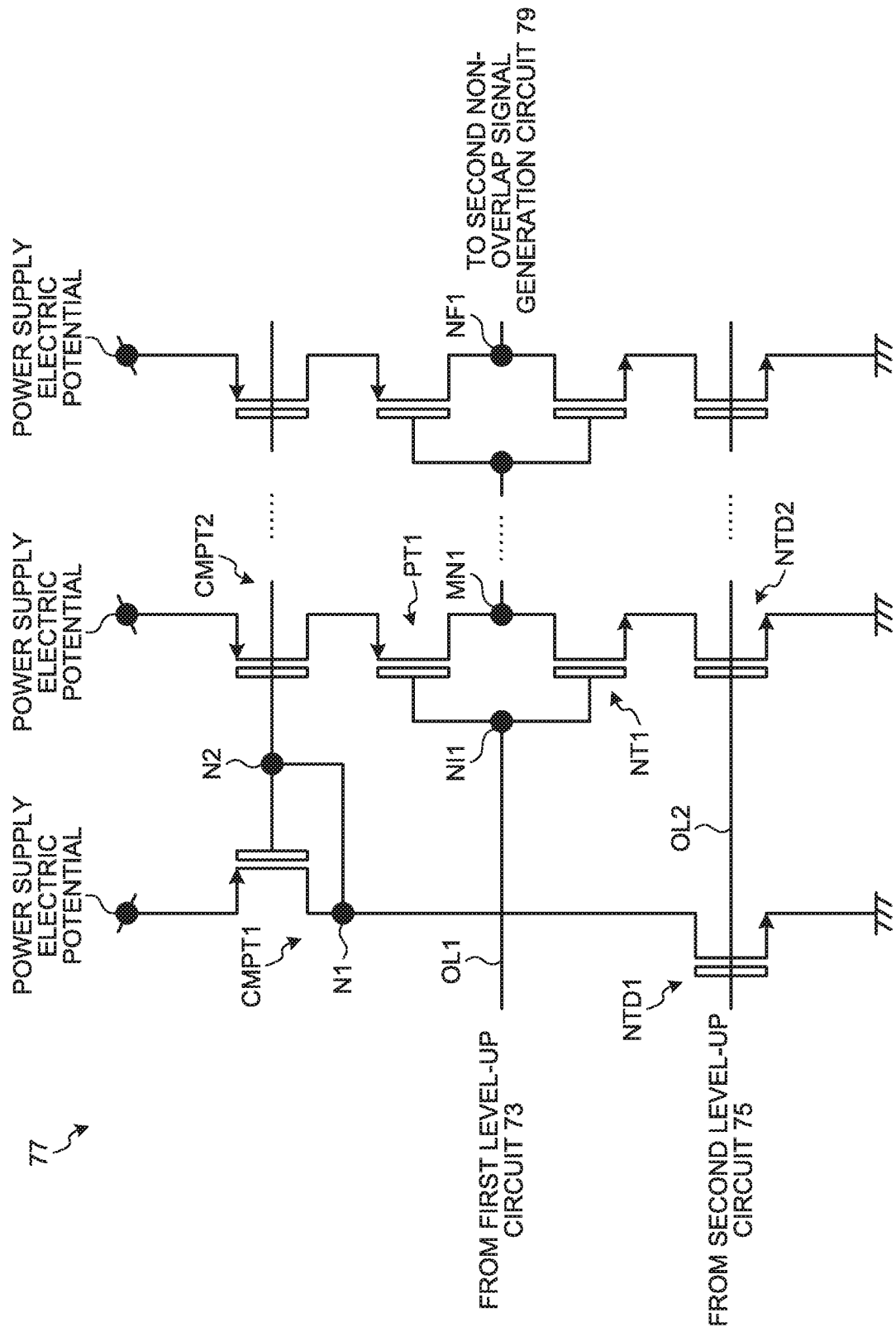
FIG. 8 is a circuit diagram illustrating an example of a delay adjustment circuit according to the first embodiment.

FIG. 8 is a circuit diagram illustrating an example of the delay adjustment circuit 77. A plurality of transistors in the circuit illustrated in FIG. 8 has second withstand voltage performance, that is, a high withstand voltage performance. An output line OL1 from the first level-up circuit 73 is electrically coupled to an input node NI1. A PMOS transistor PT1 and an NMOS transistor NT1 are inverter-coupled, the common gate is electrically coupled to the input node NI1, and a common drain is electrically coupled to an intermediate node MN1.

The intermediate node MN1 is electrically coupled to the input nodes of the PMOS and NMOS transistors inverter-coupled on the next stage. The inverter-coupled PMOS transistor and NMOS transistor are repeated over an even number of stages, for example, 2n (n is a natural number). The common drain NF1 in the PMOS transistor and the NMOS transistor that are inverter-coupled in the 2n-th stage is electrically coupled to the second non-overlap signal generation circuit 79.

An output line OL2 from the second level-up circuit 75 is electrically coupled to the gates of (2n+1) NMOS transistors disposed over (2n+1) stages. The sources of (2n+1) NMOS transistors are electrically coupled to the ground electric potential. Of the (2n+1) NMOS transistors, the drain of the first-stage NMOS transistor NTD1 is electrically coupled to the node N1. Of the (2n+1) NMOS transistors, the drain of the second stage NMOS transistor NTD2 is electrically coupled to the source of the inverter-coupled NMOS transistor NT1 in the first stage. The drains of 3 to (2n+1) NMOS transistors are electrically coupled one-to-one with the drains of the NMOS transistors that are inverter-coupled in the 2 to (2n)-th stages.

The PMOS transistor CMPT1 and each of the (2n) PMOS transistors form a current mirror circuit. The sources of the PMOS transistor CMPT1 and the (2n) PMOS transistors are both electrically coupled to the power supply electric potential. The drain of the PMOS transistor CMPT1 is electrically coupled to the node N1, and the gate is electrically coupled to the node N2. The node N1 and node N2 are electrically coupled. The node N2 is electrically coupled to the source of each of (2n) PMOS transistors. Among the (2n) PMOS transistors, the drain of the PMOS transistor CMPT2 is electrically coupled to the source of the inverter-coupled PMOS transistor PT1 in the first stage. The drains of 2 to (2n) PMOS transistors are electrically coupled one-to-one to the drains of the PMOS transistors that are inverter-coupled in the second to (2n)-th stages.

A DC voltage output from the second level-up circuit 75 is applied to the gates of (2n+1) NMOS transistors that are electrically coupled to the output line OL2. By applying the DC voltage, an ON resistance is generated for the inverter-coupled PMOS transistor and NMOS transistor. The value of the ON resistance depends on the value of the DC voltage. Thus, the time constant of the input/output response in the delay adjustment circuit 77 changes according to the value of the DC voltage output from the loop filter 85, that is, the phase difference. Therefore, the delay adjustment circuit 77 delays the first clock signal CS1 according to a delay amount based on the value of the DC voltage corresponding to the phase difference, and generates the second clock signal CS2. After the process in this step, the processes in steps S701 and S702 are repeated.

(Step S704)

If the phase difference is within the phase range (YES in step S702), the delay amount is locked. That is, the latest DC voltage output from the loop filter is locked. The second clock signal CS2 is generated using the locked delay amount, that is, the latest DC voltage. The sample and hold circuit 3 performs a sample and hold function on the input signal Vin using the first clock signal CS1 and the generated second clock signal CS2.

According to the first embodiment, in the generation of the second clock signal CS2 related to the control of the high withstand voltage device 33, adjustment has been made to delay the second clock signal CS2 such that the phase of the second clock signal CS2 is brought close to the phase of the first clock signal CS1 related to the control of the low withstand voltage device 31. As a result, by performing control to eliminate the phase difference between the first clock signal CS1 and the second clock signal CS2 as illustrated in FIGS. 5 and 6, the period in which the sample period LVSP in which the first switch element Sw1 is turned on and the sample period HVSP in which the third switch element Sw3 is turned on can be increased, for example, matched. Accordingly, in the first embodiment, the insufficient settling time can be improved as compared with the sample period in FIG. 4, and the output accuracy from the sample and hold circuit 3 can be improved. For these reasons, according to the first embodiment, the performance of the A/D converter 5 in a microprocessor, a sensor, and the like can be improved. As a result, it is possible to provide the semiconductor integrated circuit 1 capable of improving the accuracy while realizing a high-speed operation when the electrical withstand voltage differs between the input and output of the sample and hold circuit 3.

Specifically, the second clock signal CS2 was generated by shifting the voltage level of the second clock signal CS2 to a level related to the first withstand voltage, detecting a phase difference between the second clock signal CS2 and the first clock signal CS1, shifting the voltage level of a phase error signal corresponding to the detected phase difference and the voltage level of the first clock signal CS1 to the voltage level related to the second withstand voltage, and delaying the first clock signal CS1 by a delay amount corresponding to the phase error signal. This makes it possible to achieve both high tolerance and high-speed operation and high accuracy, and suppress deterioration in reliability when the electrical withstand voltage differs between input and output of signals to the sample and hold circuit 3. Further, by disposing the delay adjustment circuit 77 in the HV domain, the delay due to the first level-up circuit 73 and the like can be effectively eliminated.

(First Modification)

Figure 9:
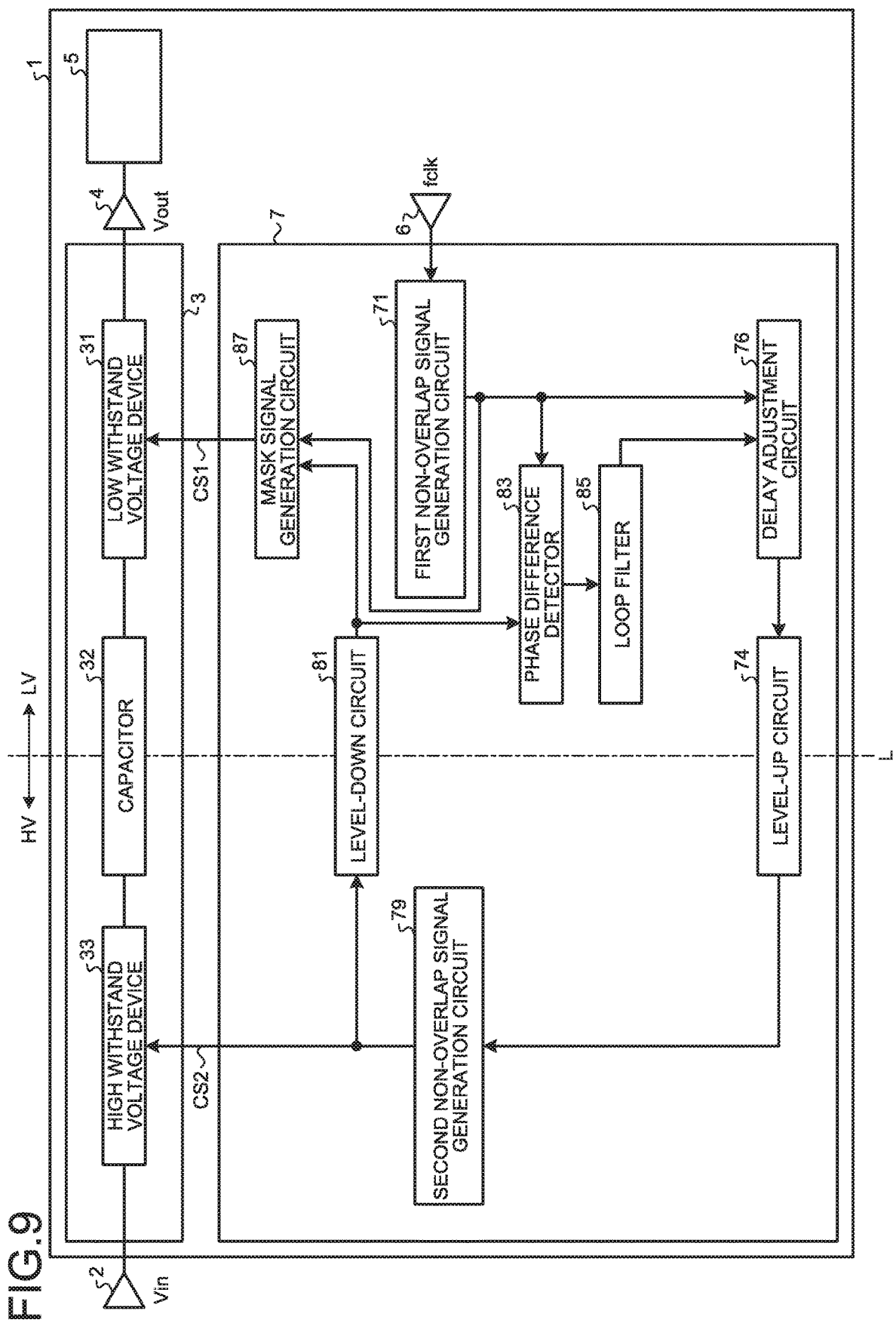
FIG. 9 is a diagram illustrating an example of a configuration of a clock generation circuit according to a first modification of the first embodiment.

A first modification is different from the first embodiment in that a delay adjustment circuit 76 is disposed in the LV domain. FIG. 9 is a diagram illustrating an example of a configuration of the clock generation circuit 7 in the first modification. A DC voltage output from the loop filter 85 and the first clock signal CS1 output from the first non-overlap signal generation circuit 71 are output to the delay adjustment circuit 76 disposed in the LV domain. The delay adjustment circuit 76 delays the first clock signal CS1 according to the value of the DC voltage and generates the second clock signal CS2. A configuration of the delay adjustment circuit 76 in the first modification is the same as the configuration of the delay adjustment circuit 77 illustrated in FIG. 8.

A plurality of transistors in the delay adjustment circuit 76 used in the first modification has a first withstand voltage performance, that is, a low withstand voltage performance. The voltage level of the second clock signal CS2 output from the delay adjustment circuit 76 is shifted in a level-up circuit 74. The second clock signal CS2 whose voltage level is shifted is output to the second non-overlap signal generation circuit 79. Since other configurations are the same as those of the first embodiment, description thereof will be omitted. In the first modification, the delay adjustment circuit 76 is disposed in the LV domain, and one level-up circuit is reduced. As a result, the first modification has an effect that the area of the semiconductor integrated circuit 1 can be reduced.

(Second Modification)

Figure 10:
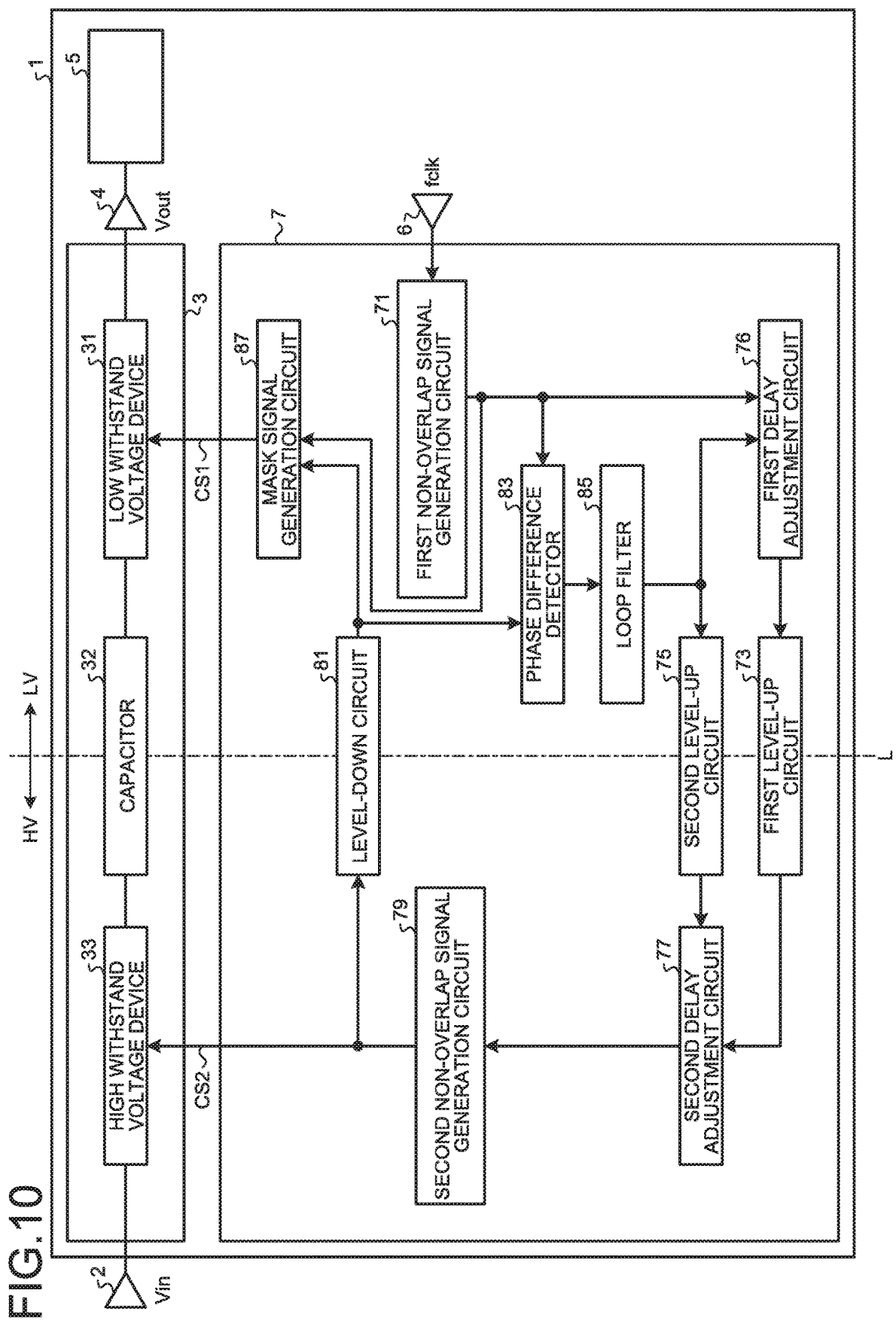
FIG. 10 is a diagram illustrating an example of a configuration of a clock generation circuit according to a second modification of the first embodiment.

A second modification is different from the first embodiment in that the first delay adjustment circuit 76 is disposed in the LV domain, and the second delay adjustment circuit 78 is disposed in the HV domain. FIG. 10 is a diagram illustrating an example of a configuration of the clock generation circuit 7 in the second modification. The semiconductor integrated circuit 1 illustrated in FIG. 10 has a configuration combining FIG. 2 and FIG. 9. Note that a DC voltage output from the loop filter 85 is appropriately adjusted according to delay in the LV domain and delay in the HV domain. Other configurations are the same as those of the first embodiment and the first modification, and thus the description thereof will be omitted. In the second modification, the first delay adjustment circuit 76 is disposed in the LV domain, and the second delay adjustment circuit 77 is disposed in the HV domain. As a result, there is an effect that the semiconductor integrated circuit 1 that can further suppress the decrease in reliability can be provided.

Second Embodiment

A difference from the first embodiment is that the first clock signal CS1 is delayed by a delay amount corresponding to a digital code adjusted such that a phase of the second clock signal CS2 approaches a phase of the first clock signal CS1 to generate the second clock signal CS2. The adjusted digital code corresponds to an ADC output digital code preselected in a delay code setting operation described later.

Figure 11:
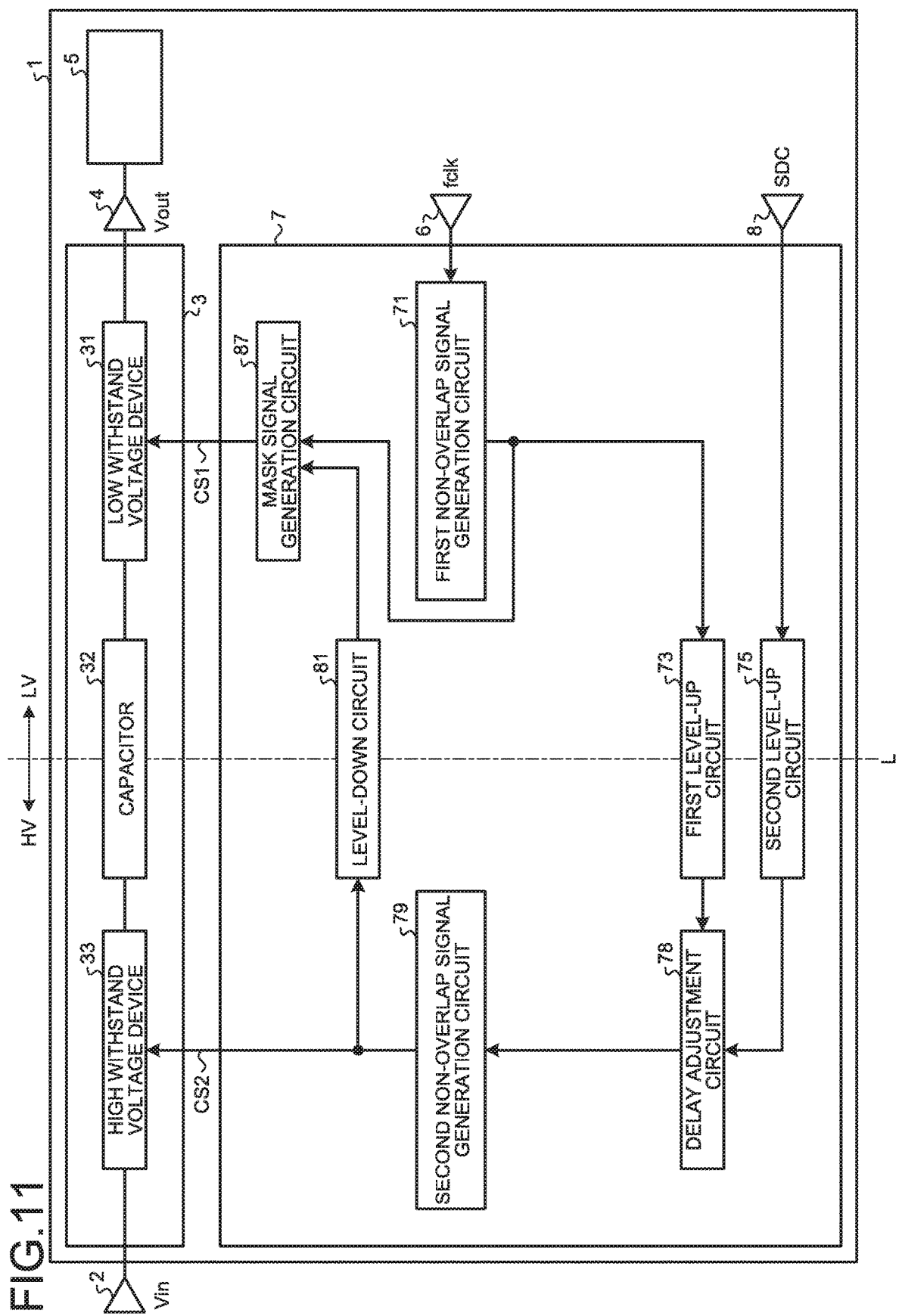
FIG. 11 is a diagram illustrating an example of a configuration of a clock generation circuit according to a second embodiment.

FIG. 11 is a diagram illustrating an example of a configuration of a clock generation circuit 7 according to the second embodiment. The clock generation circuit 7 includes a first non-overlap signal generation circuit 71, a first level-up circuit 73, a second level-up circuit 75, a delay adjustment circuit 78, a second non-overlap signal generation circuit 79, and a mask signal generation circuit 87. Similarly to the sample and hold circuit 3, the clock generation circuit 7 has the HV domain and the LV domain. Hereinafter, components and the like different from the configuration in the first embodiment will be described. Note that a semiconductor integrated circuit 1 in the second embodiment may be realized by the sample and hold circuit 3 and the clock generation circuit 7. Further, a switched capacitor may be realized by a semiconductor integrated circuit including the sample and hold circuit 3 and the clock generation circuit 7.

To the second level-up circuit 75, a delayed digital code (hereafter referred to as "delay code") SDC corresponding to the ADC output digital code (hereafter referred to as "selection code") selected in a training period before an input signal Vin is input to a high withstand voltage device 33 is input from an input terminal 8. The training period is a period for setting the delay code SDC before the input signal Vin is input to the sample and hold circuit 3. The setting of the delay code SDC during the training period will be described later. The delay code SDC is set by a control circuit described later based on the ADC output digital code selected in the training period. The set delay code SDC corresponds to a delay amount of the second clock signal CS2 with respect to the first clock signal CS1. Further, the set delay code SDC has a bit string for controlling ON/OFF of a plurality of transistors in the delay adjustment circuit 78. "1" in one bit in the bit string corresponds to High that is an operation voltage of the transistor. Further, "0" in one bit in the bit string corresponds to Low that is a non-operation voltage of the transistor. Hereinafter, to simplify the description, the number of bit strings is assumed to be sixty four, but this is not restrictive. The number of bit strings corresponds to the total number of the delay amounts. The second level-up circuit 75 increases a voltage level of the set delay code SDC so as to match the HV domain. Specifically, the second level-up circuit 75 level-ups the delay code SDC indicating High/Low in the LV domain to a High/Low signal in the HV domain.

In the generation of the second clock signal CS2, the delay adjustment circuit 78 performs adjustment to delay the second clock signal CS2 so as to bring the phase of the second clock signal CS2 close to the phase of the first clock signal CS1. That is, the delay adjustment circuit 78 is a digital code adjusted such that the phase of the second clock signal CS2 approaches the phase of the first clock signal CS1, that is, the second clock signal CS2 is generated by delaying the first clock signal CS1 by a delay amount corresponding to the set delay code SDC.

Figure 12:
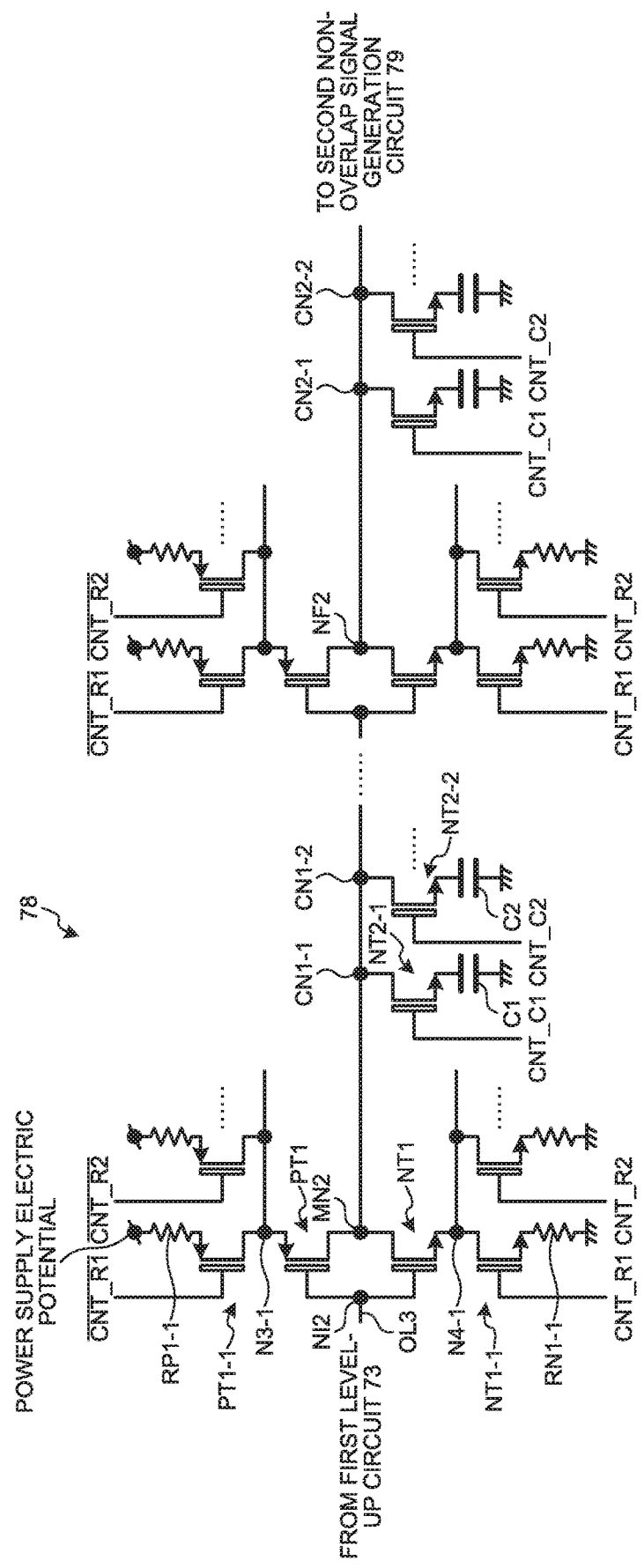
FIG. 12 is a circuit diagram illustrating an example of a delay adjustment circuit according to the second embodiment.

FIG. 12 is a circuit diagram illustrating an example of the delay adjustment circuit 78. A plurality of transistors, a plurality of resistors, and a plurality of capacitors in the circuit illustrated in FIG. 12 have second withstand voltage performance, that is, high withstand voltage performance. An output line OL3 from the first level-up circuit 73 is electrically coupled to an input node NI2. A PMOS transistor PT1 and an NMOS transistor NT1 are inverter-coupled, a common gate is electrically coupled to the input node NI2, and a common drain is electrically coupled to an intermediate node MN2. The intermediate node MN2 is electrically coupled in series with sixty four nodes CN1-1 to CN1-64 (not illustrated) corresponding to the number of bit strings (64). The node CN1-64 (not illustrated) is electrically coupled to the input nodes of the PMOS and NMOS transistors inverter-coupled on the next stage. Common drains NF2 in the PMOS and NMOS transistors inverter-coupled in the next stage are electrically coupled in series with a plurality of nodes CN2-1 to CN2-64 (not illustrated) corresponding to the number of the bit strings (64). The node CN2-64 (not illustrated) is electrically coupled to the second non-overlap signal generation circuit 79.

A source of the PMOS transistor PT1 is electrically coupled to a node N3-1. In the PMOS transistor PT1-1, the gate is electrically coupled to the output line of the first bit in the bit string output from the second level-up circuit 75, the source is electrically coupled to one end of the resistor RP1-1, and the drain is electrically coupled to the node N3-1. The other end of the resistor RP1-1 is electrically coupled to a power supply electric potential. That is, for the i-th bit ("i" is a natural number from 1 to 64) in the bit string, in a PMOS transistor PT1-$i$, a gate is electrically coupled to an output line of the i-th bit in the bit string output from the second level-up circuit 75, the source is electrically coupled to one end of a resistor RP1-$i$, and the drain is electrically coupled to a node N3-$i$. The other end of the resistor RP1-$i$ is electrically coupled to a power supply electric potential. The nodes N3-1 to N3-64 (not illustrated) are electrically coupled in series.

The source of the NMOS transistor NT1 is electrically coupled to a node N4-1. In the NMOS transistor NT1-1, the gate is electrically coupled to the output line of the first bit in the bit string output from the second level-up circuit 75, the source is electrically coupled to one end of the resistor RN1-1, and the drain is electrically coupled to the node N4-1. The other end of the resistor RN1-1 is electrically coupled to a ground electric potential. Similarly, for the i-th bit in the bit string, in the NMOS transistor NT1-$i$, the gate is electrically coupled to the output line of the i-th bit in the bit string output from the second level-up circuit 75, the source is electrically coupled to one end of the resistor RN1-$i$, and the drain is electrically coupled to the node N4-$i$. The other end of the resistor RN1-$i$ is electrically coupled to a ground electric potential. The nodes N4-1 to N4-64 (not illustrated) are electrically coupled in series.

In the NMOS transistor NT2-1, the gate is electrically coupled to the output line of the first bit in the bit string output from the second level-up circuit 75, the source is electrically coupled to one end of a capacitor C1, and the drain is electrically coupled to the node CN1-1. The other end of the capacitor C1 is electrically coupled to a ground electric potential. Similarly, for the i-th bit string, the gate of the NMOS transistor NT2-$i$ is electrically coupled to the output line of the i-th bit in the bit string output from the second level-up circuit 75, and the source is electrically coupled to one end of the capacitor Ci, and the drain is electrically coupled to the node CN1-$i$. The other end of the capacitor Ci is electrically coupled to a ground electric potential.

The electrical coupling relationship between the transistor electrically coupled to the above-described resistor and the transistor electrically coupled to the above-described capacitor is repeated in the same manner for the PMOS transistor and NMOS transistor inverter-coupled in the next stage. In FIG. 12, the outputs from the second level-up circuit 75 are illustrated as CNT_R1 to CNT_R64 (not illustrated) and CNT_C1 to CNT_C64 (not illustrated). For example, in FIG. 12, a High or Low voltage in the first bit in the bit string is applied to the gate of the PMOS transistor PT1-1 and the gate of the NMOS transistor NT1-1 coupled to CNT_R1. Further, a High or Low voltage in the first bit in the bit string is applied to the gate of the NMOS transistor NT1-1 coupled to the CNT_C1.

According to the delay code SDC set by the control circuit, described later, in the training period, the delay adjustment circuit 78 turns on and off a plurality of transistors (hereinafter referred to as "delay adjustment transistor") excluding PMOS transistors and NMOS transistors related to the inverter coupling in FIG. 12. As a result, the resistance and capacitance in the delay adjustment circuit 78 change, and the time constant of the input/output response in the delay adjustment circuit 77 changes according to the changed resistance and capacitance. The delay adjustment circuit 78 generates the second clock signal CS2 by performing delay adjustment on the first clock signal CS1 according to the change of a time constant.

Figure 13:
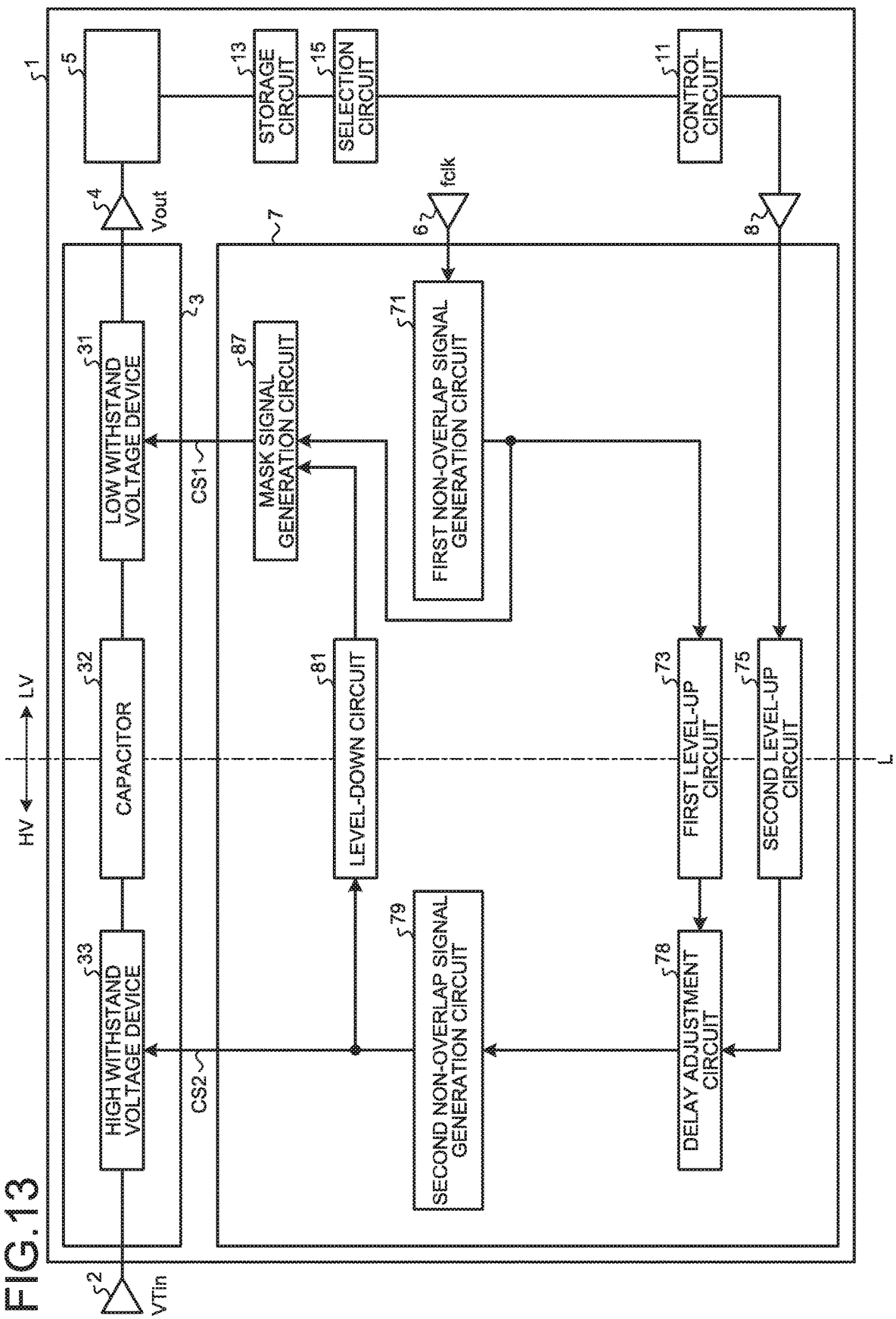
FIG. 13 is a diagram illustrating an example of a configuration of a semiconductor integrated circuit regarding a delay code setting operation according to the second embodiment.

Hereinafter, operation for setting the delay code SDC to be used in the sample and hold function for the input signal Vin (hereinafter referred to as "delay code setting operation") will be described below. The delay code setting operation is executed during the training period. The training period is provided, for example, before shipment of the semiconductor integrated circuit 1 or when the semiconductor integrated circuit 1 is activated. FIG. 13 is a diagram illustrating an example of a configuration of the semiconductor integrated circuit 1 relating to the delay code setting operation. As illustrated in FIG. 13, the semiconductor integrated circuit 1 further includes a control circuit 11, a storage circuit 13, and a selection circuit 15.

As illustrated in FIG. 13, a test signal VTin is input to the sample and hold circuit 3 during the training period. The semiconductor integrated circuit 1 acquires a plurality of ADC output digital codes obtained by changing a delay amount with respect to the first clock signal CS1 with respect to the test signal VTin. The A/D converter 5 outputs the ADC output digital code to the storage circuit 13.

The control circuit 11 sets a plurality of delay codes respectively corresponding to a plurality of different delay amounts in the training period. Each of a plurality of the delay amounts corresponds to a delay time of the second clock signal CS2 with respect to the first clock signal CS1. A plurality of the delay amounts corresponds to, for example, time intervals from a start time of the first clock signal CS1 to a plurality of time points obtained by dividing one cycle of the first clock signal CS1 by the total number of delay amounts (for example, 64). A total number of the delay amounts is preset. As described above, it is assumed that the total number of the delay amounts is sixty four. At this time, the control circuit 11 stores the set sixty four types of delay codes. Further, the delay code corresponds to a bit string for controlling ON/OFF of the delay adjustment transistor in the delay adjustment circuit 78.

The control circuit 11 inputs the test signal VTin to the input terminal 2 and inputs each of a plurality of the delay codes to the input terminal 8 during the training period. For example, the control circuit 11 sets a delay code that does not cause a delay amount (hereinafter referred to as "first delay code"). The control circuit 11 inputs the set first delay code to the second level-up circuit 75 and inputs the test signal VTin to the high withstand voltage device 33. In response to the ADC output digital code corresponding to the first delay code being stored in the storage circuit 13, the control circuit 11 inputs a second delay code corresponding to a delay amount that is delayed by 1/64 times one cycle of the first clock signal CS1 to the second level-up circuit 75, and inputs the test signal VTin to the high withstand voltage device 33.

That is, in response to the ADC output digital code corresponding to the i-th delay code corresponding to the delay amount that is delayed by i/64 times one cycle of the first clock signal CS1 being stored in the storage circuit 13 during the training period, the control circuit 11 inputs the (i+1)-th delay code corresponding to the delay amount delayed by (i+1)/64 times one cycle of the first clock signal CS1 to the second level-up circuit 75 and inputs the test signal VTin to the high withstand voltage device 33. The control circuit 11 repeats the delay code input and test signal VTin input triggered by ADC output digital code storage until the delay amount in ascending order, that is, the delay stage number i, reaches the total number 64 of the delay amount.

The storage circuit 13 includes a plurality of flip-flop circuits, for example. The storage circuit 13 stores a plurality of ADC output digital codes obtained by changing the delay amount with respect to the first clock signal CS1 with respect to the same test signal VTin during the training period. Specifically, the storage circuit 13 stores a plurality of the ADC output digital codes in association with the delay code related to the delay of the second clock signal CS2 used in the sample and hold function. That is, for the test signal VTin, each of a plurality of the ADC output digital codes obtained by changing the delay amount with respect to the first clock signal CS1 is associated with the delay amount used to acquire each of a plurality of the ADC output digital codes. The storage circuit 13 stores a correct ADC output digital code (hereinafter referred to as "correct code") for the test signal VTin.

The selection circuit 15 includes a combination logic circuit, for example. The selection circuit 15 selects, as a selection code, an ADC output digital code that is closest to the correct digital code among a plurality of the ADC output digital codes during the training period. The selection circuit 15 outputs the selection code to the control circuit 11. At this time, the control circuit 11 outputs the delay code corresponding to the selected code to the second level-up circuit 75 as the set delay code SDC.

Figure 14:
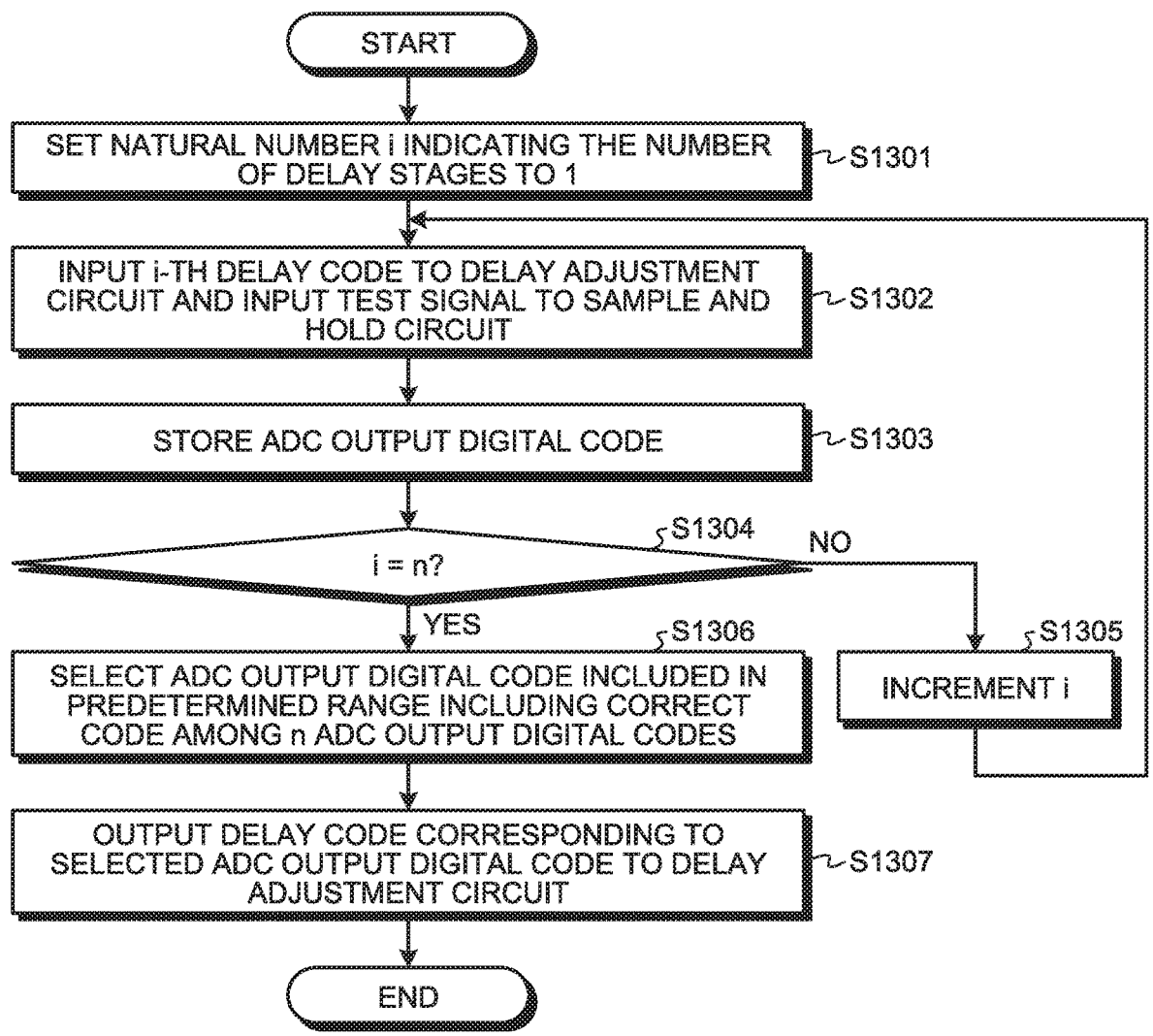
FIG. 14 is a diagram illustrating an example of an operation procedure in the delay code setting operation according to the second embodiment.

FIG. 14 is a diagram illustrating an example of an operation procedure in the delay code setting operation. The delay code setting operation is executed during the training period. That is, the delay code setting operation is executed as a foreground for AD conversion of the input signal Vin in order to select a delay code corresponding to a delay amount closest to a correct digital code (correct code). Hereinafter, to simplify the description, it is assumed that the ADC output digital code is acquired in ascending order of the number of delay stages, but this is not restrictive. For example, as a method for changing the number of the delay stages, for example, a binary search or a golden section method may be used using the ADC output digital code and the correct code acquired by the delay code setting operation. At this time, since the number of repetitions indicated in FIG. 14 can be reduced, the processing time relating to the setting of the delay code SDC can be shortened.

(Delay Code Setting Operation)

(Step S1301)

The control circuit 11 sets a natural number i indicating the number of delay stages to 1.

(Step S1302)

The control circuit 11 sets the i-th delay code. The control circuit 11 inputs the i-th delay code to the delay adjustment circuit 78 and also inputs the test signal VTin to the high withstand voltage device 33 in the sample and hold circuit 3. At this time, the delay adjustment circuit 78 generates the second clock signal CS2 by adding the i-th delay amount to the first clock signal CS1 according to the i-th delay code. The sample and hold circuit 3 performs sample and hold on the test signal VTin using the first clock signal CS1 and the generated second clock signal CS2. When the test signal VTin is, for example, a signal output by turning on the short switch in a differential circuit having the short switch, the value of the test signal VTin is differential zero (intermediate value of the input range). At this time, the correct digital code is an ADC output digital code corresponding to the intermediate value. The A/D converter 5 outputs an ADC output digital code corresponding to the i-th delay code using the sample and hold result.

(Step S1303)

The storage circuit 13 stores the ADC output digital code output from the A/D converter 5 in association with the i-th delay code.

(Step S1304)

The control circuit 11 determines whether or not the number of delay stages i is equal to the total number of delay amounts n. When the number of the delay stages i is not equal to the total number n of the delay amounts (i≠n) (NO in step S1304), the process of step S1305 is executed. When the number of the delay stage i is equal to the total number n of the delay amount (i=n) (YES in step S1304), the process of step S1306 is executed. At this time, the storage circuit 13 stores a plurality of the ADC output digital codes corresponding to the total number of the delay amounts. Note that the storage circuit 13 may store a plurality of the delay codes associated one-to-one with a plurality of the ADC output digital codes.

(Step 1305)

The control circuit 11 increments the number of the delay stages i. Next, the process from step S1302 to step S1304 is repeated using the incremented i.

(Step S1306)

The selection circuit 15 compares each of the n ADC output digital codes with the correct code. According to the comparison, of the n ADC output digital codes, the selection circuit 15 selects one ADC output digital code included in a predetermined range including a correct code (hereafter referred to as "correct range") as a selection code. When the correct range includes a plurality of the ADC output digital codes, the selection circuit 15 selects, for example, the ADC output digital code that matches or is closest to the correct code as the selection code. Note that the selection code is not limited to the ADC output digital code that matches or is closest to the correct code, and any ADC output digital code may be selected as long as it is included in the correct range.

Figure 15:
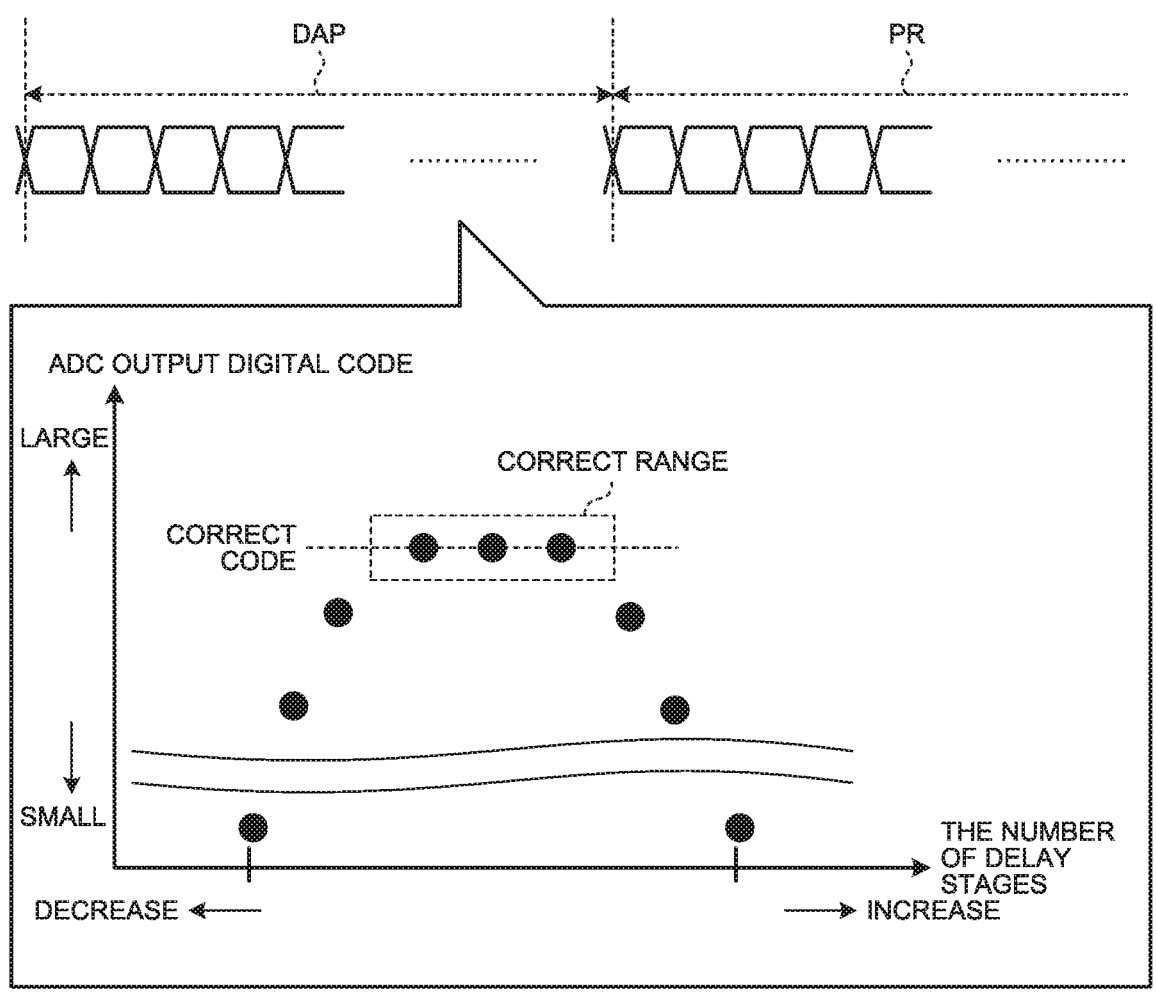
FIG. 15 is a diagram illustrating an example of a plurality of ADC output digital codes and the number of delay stages obtained in a period in which the delay code setting operation is executed according to the second embodiment.

FIG. 15 is a diagram illustrating an example of a plurality of ADC output digital codes and the number of delay stages obtained in the training period DAP in which the delay code setting operation is executed. As illustrated in FIG. 15, a plurality of the ADC output digital codes included in the correct range including the correct code are candidates to be selected by the selection circuit 15. The graph in FIG. 15 indicates the characteristic (settling characteristic) that the ADC output digital code converges to the correct code as the phase difference approaches 0 degrees. For example, of a plurality of the ADC output digital codes included in the correct range, the selection circuit 15 selects the ADC output digital code with a delay stage in the middle as a selection code that improves the characteristics of the A/D converter 5. The selection code corresponds to an ADC output digital code with good settling characteristics.

(Step S1307)

The control circuit 11 outputs the delay code SDC corresponding to the selected ADC output digital code (selection code) to the delay adjustment circuit 78 via the second level-up circuit 75. This step ends the training period. After this step, sampling and holding are performed on the input signal Vin in the period PR in FIG. 15.

According to the second embodiment, the first clock signal CS1 is delayed by a delay amount corresponding to a digital code (selected code) adjusted such that the phase of the second clock signal CS2 approaches the phase of the first clock signal CS1. Thus, the second clock signal CS2 is generated. As a result, as illustrated in FIG. 15, since the delay amount set using the ADC output digital code with good settling characteristics can be added to the first clock signal CS1, when the electrical withstand voltage differs between input and output of the input signal Vin, there is an effect that the performance of the A/D converter 5 can be improved, and the semiconductor integrated circuit 1 capable of suppressing the decrease in reliability can be provided.

Specifically, in the delay code setting operation, for the test signal VTin, each of a plurality of the digital codes obtained by changing the delay amount with respect to the first clock signal CS1 is associated with the delay amount used to acquire each of a plurality of the digital codes, and the second clock signal is generated using the delay amount closest to the correct digital code for the test signal VTin among a plurality of the digital codes. This makes it possible to achieve both high tolerance and high-speed operation and high accuracy, and when the electrical withstand voltage differs between input and output of the signal to the sample and hold circuit 3, the semiconductor integrated circuit 1 capable of improving accuracy while realizing high-speed operation can be provided, and for example, the performance of the A/D converter 5 can be improved. In addition, since the phase difference detector 83 and the loop filter 85 are not necessary, the area of the semiconductor integrated circuit 1 can be reduced.

(First Modification)

Figure 16:
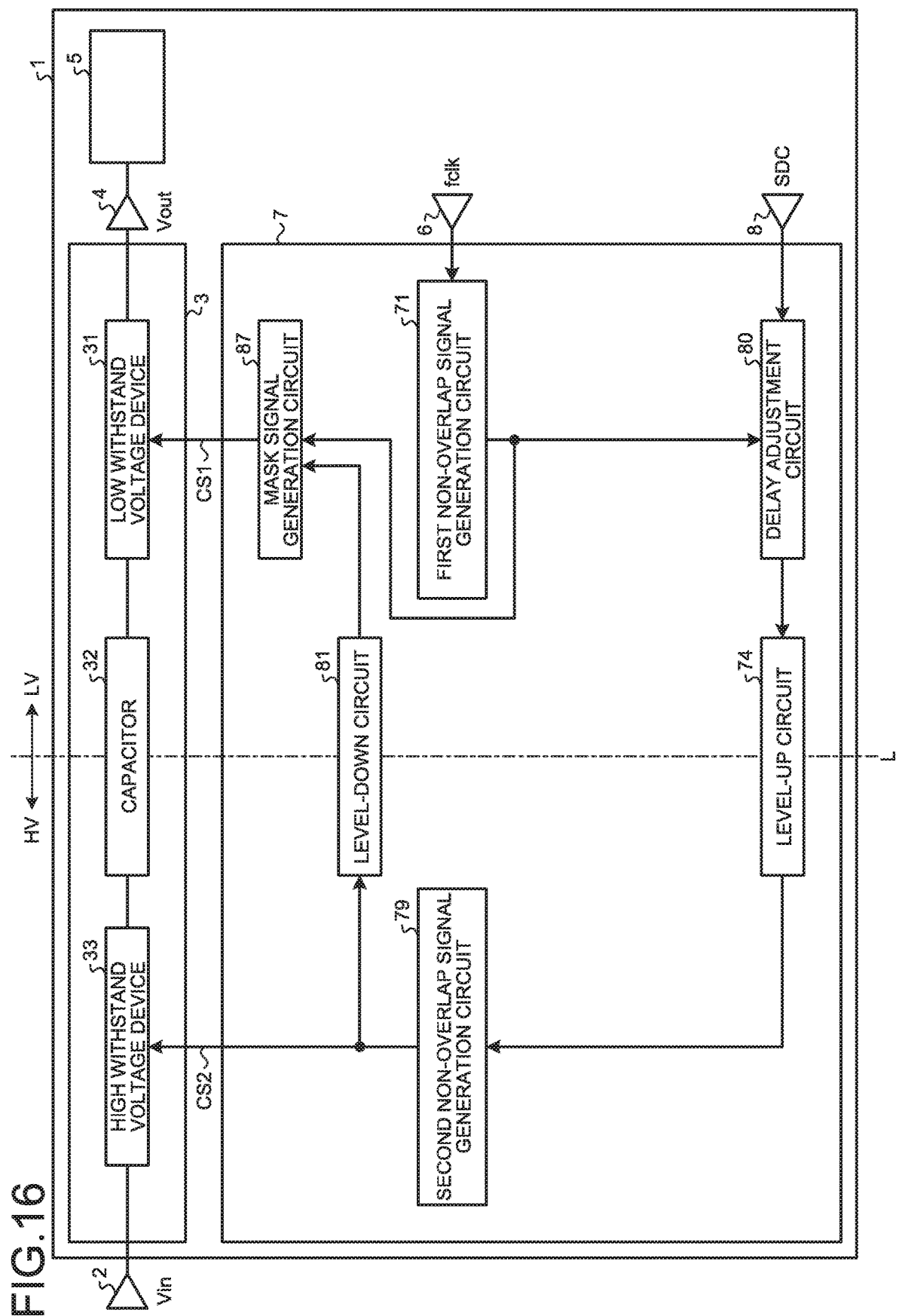
FIG. 16 is a diagram illustrating an example of a configuration of a clock generation circuit according to a first modification of the second embodiment.
Figure 17:
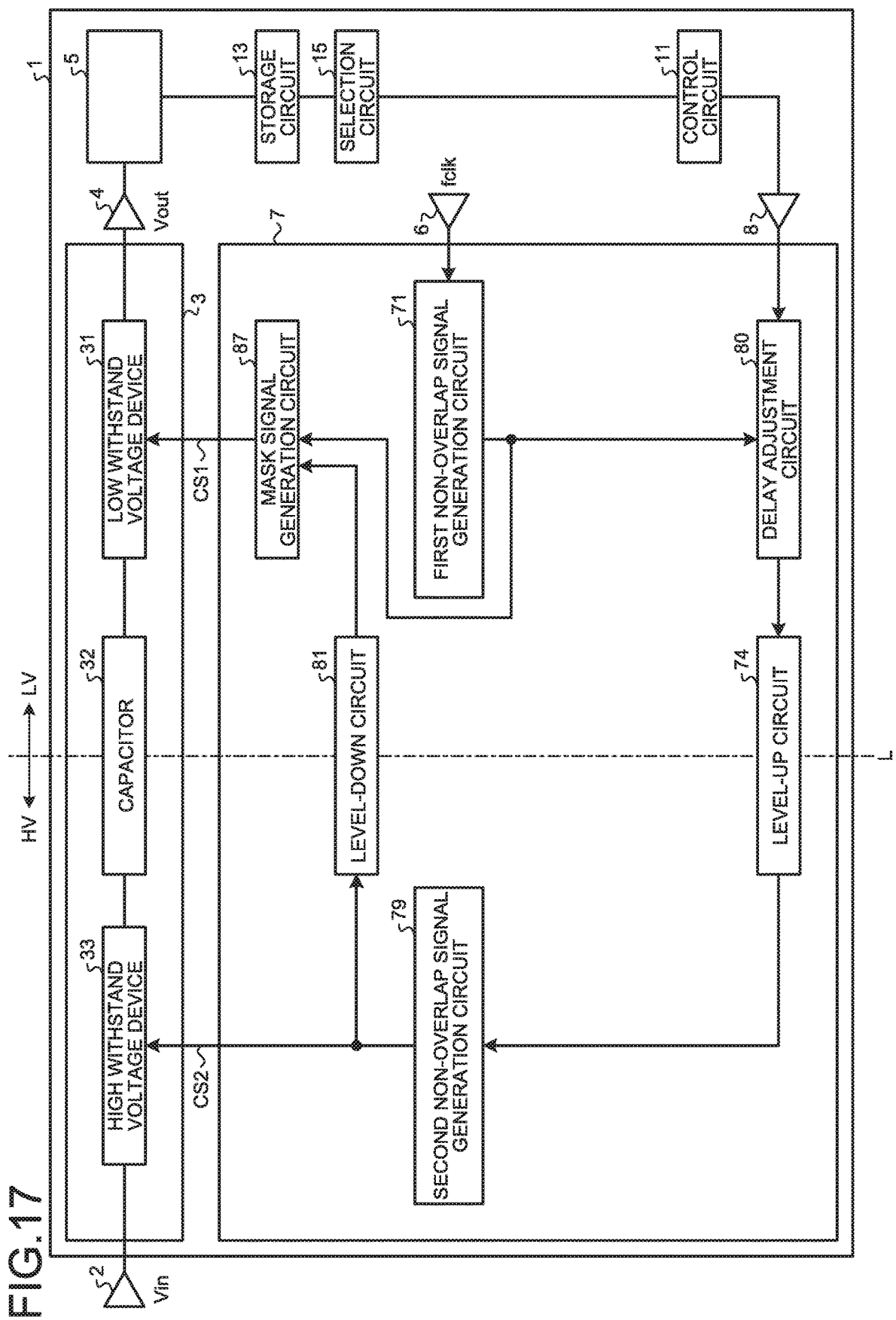
FIG. 17 is a diagram illustrating an example of a configuration of a semiconductor integrated circuit regarding a delay code setting operation according to the first modification of the second embodiment.

The first modification of the second embodiment is different from the second embodiment in that the delay adjustment circuit is disposed in the LV domain. FIG. 16 is a diagram illustrating an example of a configuration of the clock generation circuit 7 in the first modification. FIG. 17 is a diagram illustrating an example of a configuration of the semiconductor integrated circuit 1 relating to the delay code setting operation. The set delay code SDC and the first clock signal CS1 output from the first non-overlap signal generation circuit 71 are output to the delay adjustment circuit 80 disposed in the LV domain. The delay adjustment circuit 80 delays the first clock signal CS1 according to the set delay code SDC to generate the second clock signal CS2. The configuration of the delay adjustment circuit 80 in the first modification is the same as the configuration of the delay adjustment circuit 78 of FIG. 12.

In the first modification of the second embodiment, a plurality of transistors, a plurality of resistors, and a plurality of capacitors in the delay adjustment circuit 78 illustrated in FIG. 12 have first withstand voltage performance, that is, low withstand voltage performance. The voltage level of the second clock signal CS2 output from the delay adjustment circuit 80 is shifted in the level-up circuit 74. The second clock signal CS2 whose voltage level is shifted is output to the second non-overlap signal generation circuit 79. Since other configurations are the same as those of the second embodiment, description thereof will be omitted. In the first modification, the delay adjustment circuit 78 is disposed in the LV domain, and one level-up circuit is reduced. As a result, the first modification has an effect that the area of the semiconductor integrated circuit 1 can be reduced.

(Second Modification)

Figure 18:
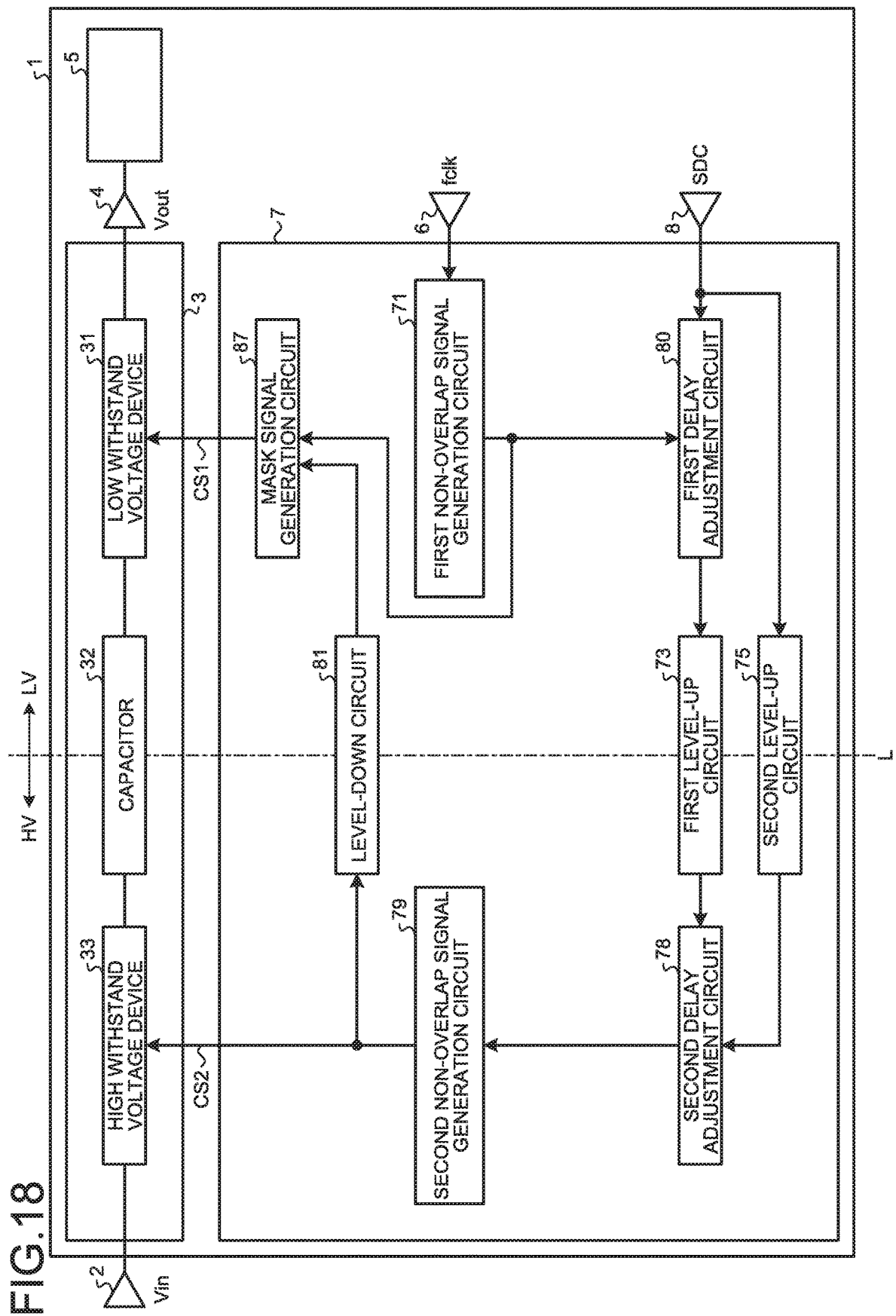
FIG. 18 is a diagram illustrating an example of a configuration of a clock generation circuit according to a second modification of the second embodiment.
Figure 19:
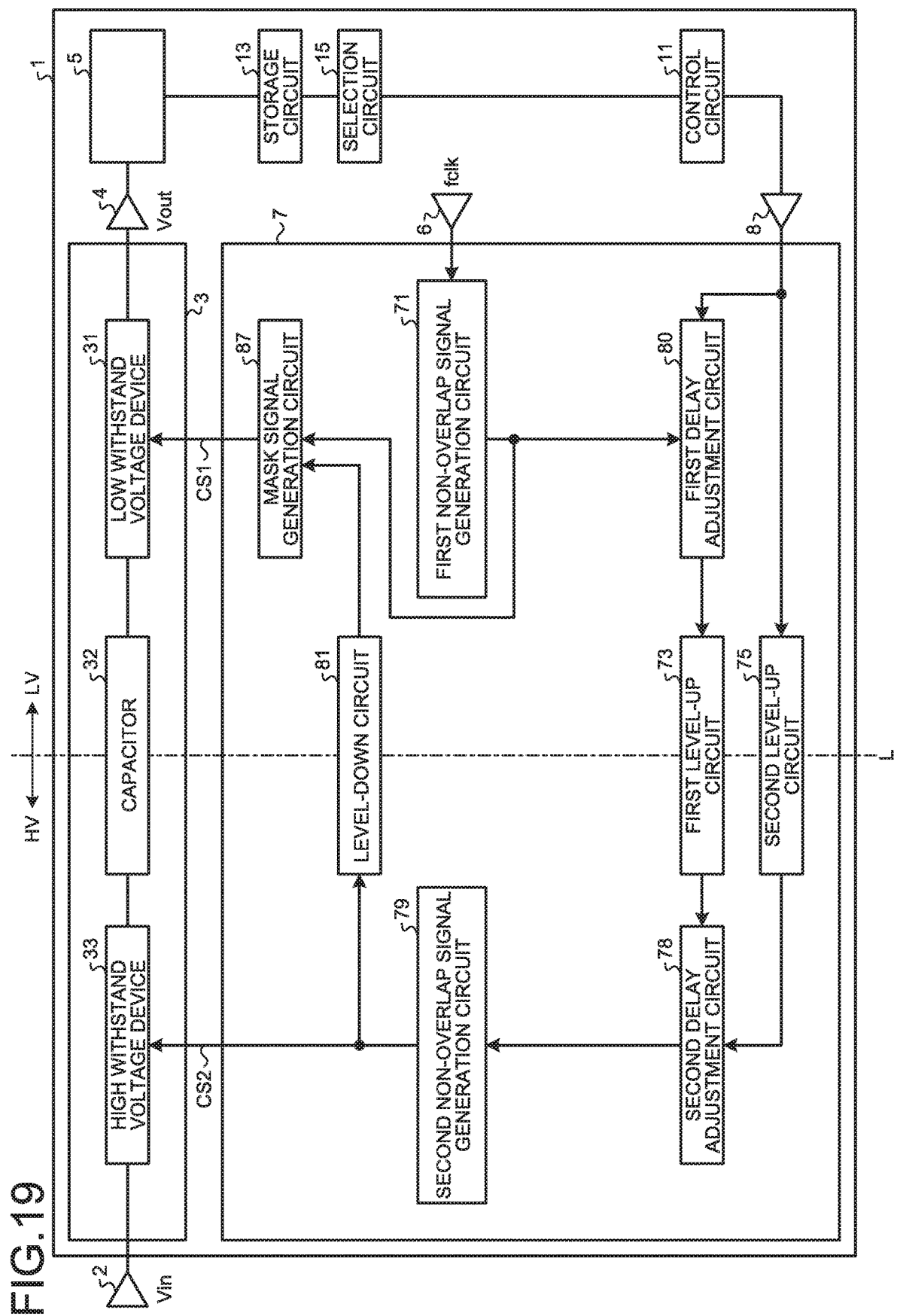
FIG. 19 is a diagram illustrating an example of a configuration of a semiconductor integrated circuit regarding a delay code setting operation in the second modification of the second embodiment.

The second modification of the second embodiment is different from the second embodiment in that the first delay adjustment circuit is disposed in the LV domain, and the second delay adjustment circuit is disposed in the HV domain. FIG. 18 is a diagram illustrating an example of a configuration of the clock generation circuit 7 in the second modification. The clock generation circuit 7 illustrated in FIG. 18 has a configuration combining FIGS. 11 and 16. FIG. 19 is a diagram illustrating an example of a configuration of the semiconductor integrated circuit 1 relating to the delay code setting operation. The set delay code SDC is appropriately adjusted according to delay in the LV domain and delay in the HV domain. Other configurations are the same as those of the second embodiment and the first modification of the second embodiment, and thus the description thereof will be omitted. In the second modification, the first delay adjustment circuit 80 is disposed in the LV domain, and the second delay adjustment circuit 78 is disposed in the HV domain. As a result, in the second modification, there is an effect that the semiconductor integrated circuit 1 that can further suppress the decrease in reliability can be provided.

Third Embodiment

Figure 20:
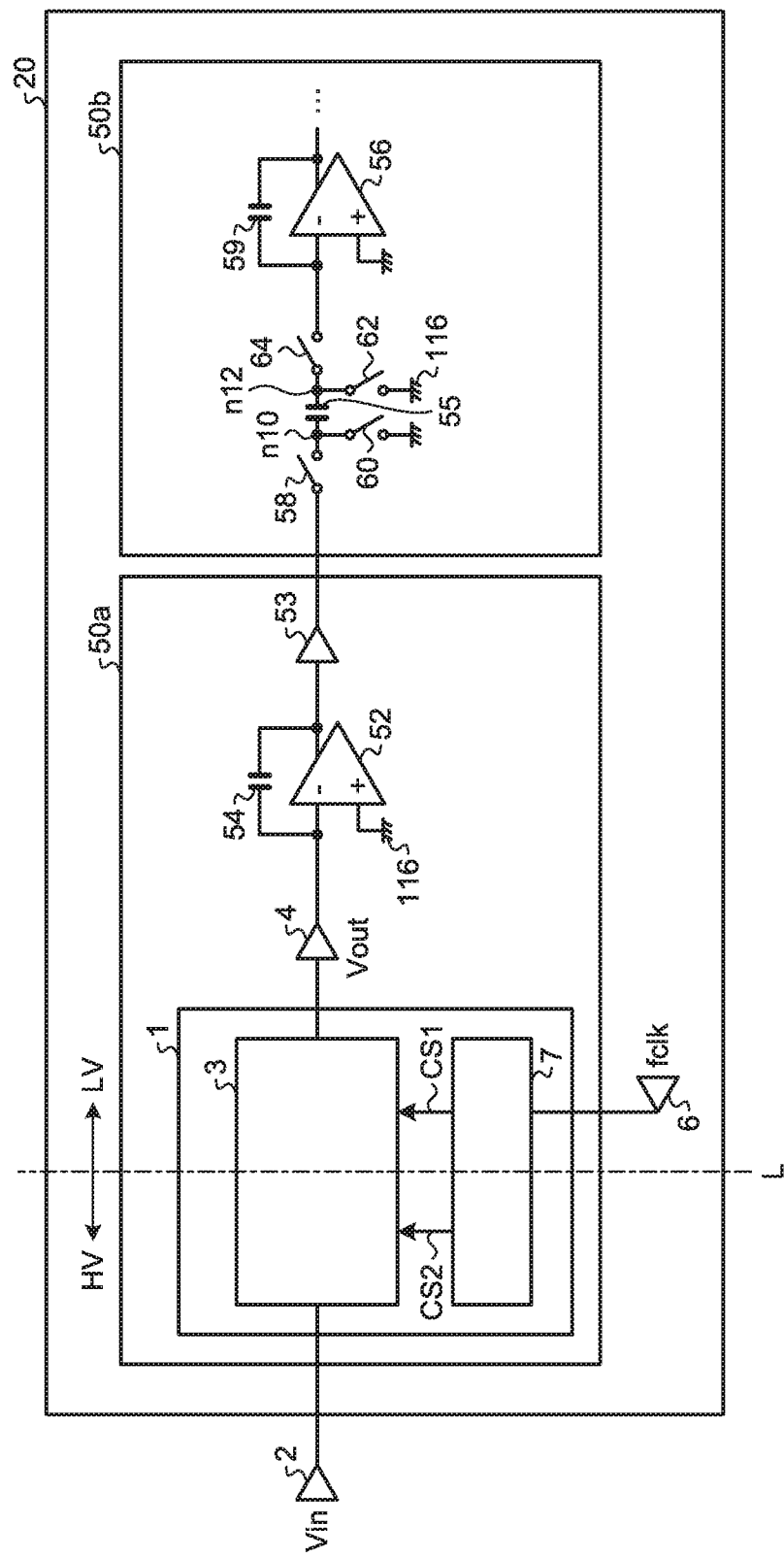
FIG. 20 is a diagram illustrating an example of a delta sigma-type A/D converter having a semiconductor integrated circuit according to a third embodiment.

A third embodiment is different from the first and second embodiments in that a delta sigma (ΔΣ)-type A/D converter is used as the A/D converter 5. Hereinafter, an example in which the semiconductor integrated circuit 1 according to the first or second embodiment is applied to a first-stage integration circuit of the delta sigma-type A/D converter will be described. FIG. 20 is a diagram illustrating an example of a delta sigma-type A/D converter 20 having the semiconductor integrated circuit 1 excluding the A/D converter 5 of FIG. 1. As illustrated in FIG. 20, the delta sigma-type A/D converter 20 includes a first-stage integration circuit 50*a* and a next-stage integration circuit 50*b*. The delta sigma-type A/D converter 20 includes a comparator, a DA converter, a differential amplifier, and the like (not illustrated) in addition to the circuit illustrated in FIG. 20.

The first-stage integration circuit 50*a* includes a sample and hold circuit 3, an operational amplifier 52, and a second capacitor 54. The inverting input terminal of the operational amplifier 52 is coupled to the output terminal 4 of the sample and hold circuit 3. The non-inverting input terminal is coupled to the common mode voltage 116 on the first withstand voltage (low withstand voltage) side. The second capacitor 54 is coupled to the inverting input terminal of the operational amplifier 52 and the output terminal 53 of the operational amplifier 52.

The next-stage integration circuit 50*b* includes a third capacitor 55, a fifth switch element 58, a sixth switch element 60, a seventh switch element 62, an eighth switch element 64, an operational amplifier 56, and a fourth capacitor 59. The third capacitor 55 is a sampling and holding capacitor, samples and holds a signal output from the first-stage integration circuit 50*a*.

The fifth to eighth switch elements 58, 60, 62, and 64 are composed of, for example, MOS transistors. More specifically, the fifth switch element 58 has one end coupled to the output terminal 53 of the operational amplifier 52 and the other end coupled to one end (node n10) of the third capacitor 55. The fifth switch element 58 is turned on or off by the first switch signal output from the first withstand voltage device.

The sixth switch element 60 has one end coupled to one end (node n10) in the third capacitor 55 and the other end coupled to the common mode voltage 116 of the device on the first withstand voltage side. The sixth switch element 60 is turned on or off by the second switch signal output from the first withstand voltage device.

The seventh switch element 62 has one end coupled to the other end (node n12) of the third capacitor 55 and the other end coupled to the common mode voltage 116 of the device on the first withstand voltage side. The seventh switch element 62 operates in accordance with the first switch signal output from the first withstand voltage device using the reference clock signal flck.

The eighth switch element 64 has one end coupled to the other end (node n12) of the third capacitor 55 and the other end coupled to the inverting input terminal of the operational amplifier 56. The eighth switch element 64 operates according to the second switch signal output from the first withstand voltage device.

The inverting input terminal of the operational amplifier 56 is coupled to the other end of the eighth switch element 64, and the non-inverting input terminal is coupled to the common mode voltage 116 of the device on the first withstand voltage side. The fourth capacitor 59 is coupled to the inverting input terminal of the operational amplifier 56 and the output terminal of the operational amplifier 56.

In the hold period of the sample and hold circuit 3, the fifth switch element 58 and the seventh switch element 62 are in a cut-off state, and the sixth switch element 60 and the eighth switch element 64 are in a conductive state. Thereby, first, during the conduction period of the second switch element Sw2, the electric charge accumulated in the capacitor 32 is distributed to the second capacitor 54 and stored. At this time, the electric charge accumulated in the third capacitor 55 is distributed to the fourth capacitor 59 in the next stage.

Subsequently, during a period when the first clock signal is High, the fifth switch element 58 and the seventh switch element 62 are in a conductive state, and the sixth switch element 60 and the eighth switch element 64 are in a cut-off state. As a result, the charge accumulated in the second capacitor 54 is distributed to the third capacitor 55.

As described above, according to the third embodiment, the semiconductor integrated circuit 1 is applied to the first-stage integration circuit 50a of the delta sigma-type A/D converter 20. This makes it possible to synchronize the hold period of the second withstand voltage input signal Vin with the hold period of the third capacitor 55 and realize the delta sigma-type A/D converter 20 that performs sampling at the cycle of the second switch signal.

Fourth Embodiment

Figure 21:
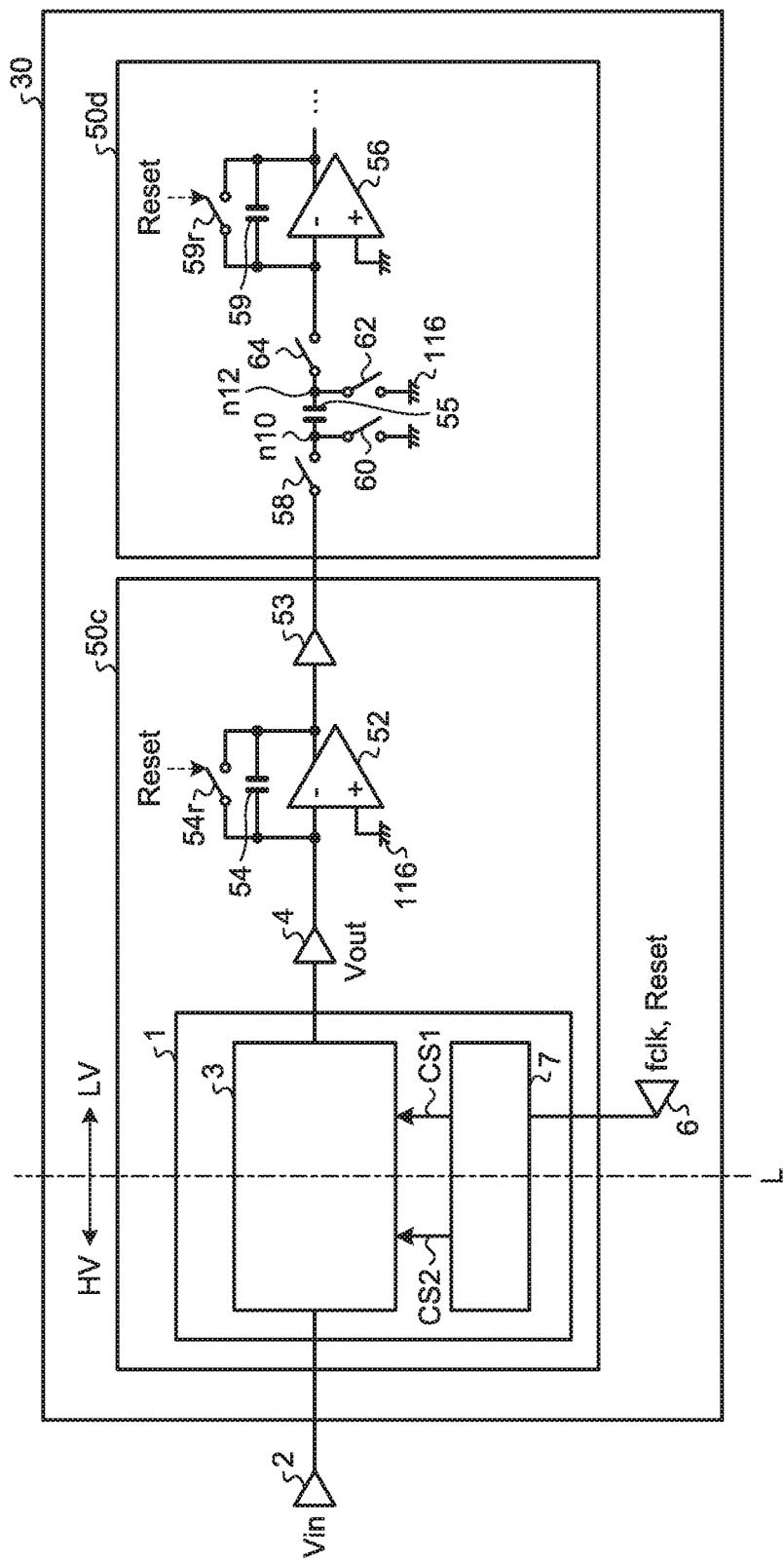
FIG. 21 is a diagram illustrating an example of an incremental delta sigma-type A/D converter including a semiconductor integrated circuit according to a fourth embodiment.

A fourth embodiment is different from the first and second embodiments in that an incremental delta sigma (ΔΣ)-type A/D converter is used as the A/D converter 5. Hereinafter, an example in which the semiconductor integrated circuit 1 according to the first or second embodiment is applied to the first-stage integration circuit of the incremental delta sigma-type A/D converter will be described. FIG. 21 is a diagram illustrating an example of the incremental delta sigma-type A/D converter 30 having the semiconductor integrated circuit 1 excluding the A/D converter 5 in FIG. 1. As illustrated in FIG. 21, the incremental delta sigma-type A/D converter 30 is different from the delta sigma-type A/D converter 20 according to the third embodiment in that negative feedback circuits of the operational amplifier 52 and the operational amplifier 56 are further provided with reset switches 54r and 59r. This reset is generally used in applications that require A/D conversion without history (independent of the past) by resetting (initializing) the integration circuit for each data rate. Hereinafter, differences from the delta sigma-type A/D converter 20 according to the third embodiment will be described.

The first-stage integration circuit 50c further includes a reset switch 54r at the inverting input terminal of the operational amplifier 52 and the output terminal 53 of the operational amplifier 52. The reset switch 54r is turned on or off by a reset signal Reset. That is, the reset switch 54r is in a conductive state when the reset signal Reset is at an H level and is in a cut-off state when the reset signal Reset is at an L level. A cycle of the reset signal Reset corresponds to a data rate cycle. When resetting is performed, the integration circuit is initialized (A/D converter is forcibly stopped), and when reset is released, another conversion is started.

The next-stage integration circuit 50d further includes a reset switch 59r at the inverting input terminal of the operational amplifier 56 and the output terminal 53 of the operational amplifier 52. The reset switch 59r is synchronized with the reset switch 54r and is turned on or off by the reset signal Reset.

Thus, the first-stage integration circuit 50c is different from the first-stage integration circuit 50a in the third embodiment by resetting the second capacitor 54 at the data rate cycle. Similarly, the next-stage integration circuit 50d is different from the next-stage integration circuit 50d of the third embodiment by resetting the fourth capacitor 59 at the data rate cycle.

As described above, according to the fourth embodiment, the semiconductor integrated circuit 1 is applied to the first-stage integration circuit 50c of the incremental delta sigma-type A/D converter 30. As a result, while synchronizing the hold period of the second withstand voltage input signal Vin with the hold period of the third capacitor 55, the fourth capacitor 59 can be reset, and an incremental delta sigma-type A/D converter 30 that performs sampling at the cycle of the second switch signal can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a sample and hold circuit having a device with a first withstand voltage and a device with a second withstand voltage that is higher than the first withstand voltage; and
   a clock generation circuit that generates a first clock signal to be supplied to the first withstand voltage device and generates a second clock signal to be supplied to the second withstand voltage device based on the first clock signal,
   wherein the clock generation circuit comprises:
      a delay adjustment circuit that performs adjustment to delay the second clock signal to bring a phase of the second clock signal close to a phase of the first clock signal in the generation of the second clock signal, and
      a level-up circuit that shifts a voltage level of the first clock signal to a voltage level related to the second withstand voltage,
   the delay adjustment circuit coupled to at least one of a front stage of the level-up circuit and a subsequent stage of the level-up circuit.

2. The semiconductor integrated circuit according to claim 1, wherein the clock generation circuit further comprises:
   a level-down circuit that shifts a voltage level of the second clock signal to a level related to the first withstand voltage; and
   a phase difference detector that generates a phase error signal corresponding to a phase difference between a level down signal of the second clock signal output from the level-down circuit and the first clock signal, and
   the delay adjustment circuit delays the first clock signal by a delay amount corresponding to the phase error signal and generates the second clock signal.

3. The semiconductor integrated circuit according to claim 2, wherein
the clock generation circuit further comprises a loop filter that removes a frequency ripple component in the phase error signal and smooths the phase error signal, and
the delay adjustment circuit delays the first clock signal by a delay amount corresponding to the smoothed phase error signal and generates the second clock signal.

4. The semiconductor integrated circuit according to claim 3, wherein the phase difference detector and the loop filter are disposed in a region corresponding to the first withstand voltage.

5. The semiconductor integrated circuit according to claim 1, wherein the clock generation circuit further comprises:
a level-down circuit that shifts a voltage level of the second clock signal to a level related to the first withstand voltage; and
a phase difference detector that generates a phase error signal corresponding to a phase difference between a level down signal of the second clock signal output from the level-down circuit and the first clock signal, and
the delay adjustment circuit delays the first clock signal by a delay amount corresponding to the phase error signal and generates the second clock signal.

6. The semiconductor integrated circuit according to claim 1, wherein
the delay adjustment circuit delays the first clock signal by a delay amount corresponding to a digital code adjusted so as to bring a phase of the second clock signal close to a phase of the first clock signal and generates the second clock signal.

7. The semiconductor integrated circuit according to claim 6, further comprising:
an A/D converter electrically coupled to an output terminal of the sample and hold circuit;
a control circuit that inputs a test signal to the second withstand voltage device and inputs a plurality of digital codes set in advance respectively corresponding to a plurality of delay amounts to the delay adjustment circuit, in a training period that sets the adjusted digital code;
a storage circuit that stores a plurality of output digital codes output by the A/D converter by changing a delay amount with respect to the first clock signal by each of a plurality of the set digital codes and stores a correct digital code for the test signal; and
a selection circuit that selects, as the adjusted digital code, an output digital code that is closest to the correct digital code among a plurality of the output digital codes.

8. The semiconductor integrated circuit according to claim 1, wherein
the delay adjustment circuit delays the first clock signal by a delay amount corresponding to a digital code adjusted so as to bring a phase of the second clock signal close to a phase of the first clock signal and generates the second clock signal.

9. The semiconductor integrated circuit according to claim 1, wherein
the sample and hold circuit further comprises:
a capacitor having one end electrically coupled to the first withstand voltage device and the other end electrically coupled to the second withstand voltage device,
the first withstand voltage device comprises:
a first switch element having one end electrically coupled to the capacitor and the other end coupled to a common mode voltage; and
a second switch element having one end electrically coupled to a node provided between the capacitor and the first switch element and the other end electrically coupled to an output terminal, and
the second withstand voltage device comprises:
a third switch element having one end electrically coupled to the capacitor and the other end electrically coupled to an input terminal; and
a fourth switch element having one end electrically coupled to a node provided between the capacitor and the third switch element and the other end coupled to a common mode voltage.

10. The semiconductor integrated circuit according to claim 9, wherein
the first clock signal has a first switch signal and a second switch signal,
the second clock signal has a third switch signal and a fourth switch signal,
the first switch element is operated by the first switch signal,
the second switch element is operated by the second switch signal,
the third switch element is operated by the third switch signal, and
the fourth switch element is operated by the fourth switch signal.

11. The semiconductor integrated circuit according to claim 10, wherein
the clock generation circuit further comprises:
a first non-overlap signal generation circuit that generates the first switch signal and the second switch signal such that a conduction state of the first switch element and a conduction state of the second switch element do not overlap;
a second non-overlap signal generation circuit that generates the third switch signal and the fourth switch signal such that a conduction state of the third switch element and a conduction state of the fourth switch element do not overlap.

12. The semiconductor integrated circuit according to claim 10, wherein
the clock generation circuit further comprises:
a mask signal generation circuit that generates a first switch signal such that a conduction state of the first switch element and a conduction state of the fourth switch element do not overlap, and generates a second switch signal such that a conduction state of the second switch element and a conduction state of the third switch element do not overlap.

13. An A/D converter, comprising the semiconductor integrated circuit according to claim 1.

14. A delta sigma-type A/D converter, comprising the semiconductor integrated circuit according to claim 1.

15. An incremental delta sigma-type A/D converter, comprising the semiconductor integrated circuit according to claim 1.

16. A switched capacitor, comprising the semiconductor integrated circuit according to claim 1.

* * * * *